(12) United States Patent
Gomes et al.

(10) Patent No.: US 11,978,727 B2
(45) Date of Patent: May 7, 2024

(54) PACKAGE ON ACTIVE SILICON SEMICONDUCTOR PACKAGES

(71) Applicant: Intel Corporation, Santa Clara, CA (US)

(72) Inventors: Wilfred Gomes, Portland, OR (US); Sanka Ganesan, Chandler, AZ (US); Doug Ingerly, Santa Clara, CA (US); Robert Sankman, Phoenix, AZ (US); Mark Bohr, Aloha, OR (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/641,922

(22) PCT Filed: Sep. 28, 2017

(86) PCT No.: PCT/US2017/054038
§ 371 (c)(1),
(2) Date: Feb. 25, 2020

(87) PCT Pub. No.: WO2019/066859
PCT Pub. Date: Apr. 4, 2019

(65) Prior Publication Data
US 2021/0013188 A1    Jan. 14, 2021

(51) Int. Cl.
*H01L 25/10* (2006.01)
*H01L 25/00* (2006.01)
*H01L 25/065* (2023.01)

(52) U.S. Cl.
CPC ........ *H01L 25/105* (2013.01); *H01L 25/0657* (2013.01); *H01L 25/50* (2013.01);
(Continued)

(58) Field of Classification Search
CPC ... H01L 25/105; H01L 25/50; H01L 25/0657; H01L 2225/06586; H01L 2225/06513;
(Continued)

(56) References Cited

U.S. PATENT DOCUMENTS 6,387,793 B1 *  5/2002  Yap ..................... H01L 24/11
                                            257/E21.508
2008/0157331 A1  7/2008  Onodera
(Continued)

FOREIGN PATENT DOCUMENTS

KR       20150090442    8/2015
KR       20150129348    11/2015

OTHER PUBLICATIONS

Search Report for European Patent Application No. 17927569.8 dated Apr. 7, 2021, 8 pages.
(Continued)

*Primary Examiner* — Kyoung Lee
*Assistant Examiner* — Christina A Sylvia
(74) *Attorney, Agent, or Firm* — Schwabe, Williamson & Wyatt, P.C.

(57) ABSTRACT

Systems and methods for providing a low profile stacked die semiconductor package in which a first semiconductor package is stacked with a second semiconductor package and both semiconductor packages are conductively coupled to an active silicon substrate that communicably couples the first semiconductor package to the second semiconductor package. The first semiconductor package may conductively couple to the active silicon substrate using a plurality of interconnects disposed in a first interconnect pattern having a first interconnect pitch. The second semiconductor package may conductively couple to the active silicon substrate using a plurality of interconnects disposed in a second interconnect pattern having a second pitch that is greater
(Continued)

than the first pitch. The second semiconductor package may be stacked on the first semiconductor package and conductively coupled to the active silicon substrate using a plurality of conductive members or a plurality of wirebonds.

20 Claims, 12 Drawing Sheets

(52) U.S. Cl.
CPC ............... *H01L 2225/06513* (2013.01); *H01L 2225/06524* (2013.01); *H01L 2225/06586* (2013.01); *H01L 2225/1035* (2013.01); *H01L 2225/1041* (2013.01); *H01L 2225/1052* (2013.01); *H01L 2225/1058* (2013.01)

(58) Field of Classification Search
CPC ..... H01L 2225/1058; H01L 2225/1052; H01L 2225/06524; H01L 2225/1041; H01L 2225/1035
See application file for complete search history.

(56) References Cited

U.S. PATENT DOCUMENTS

| | | | |
|---|---|---|---|
| 2012/0326281 A1* | 12/2012 | Pagaila | H01L 24/20 |
| | | | 257/E21.705 |
| 2013/0175702 A1* | 7/2013 | Choi | H01L 23/3114 |
| | | | 257/774 |
| 2013/0187266 A1 | 7/2013 | Chen | |
| 2013/0341786 A1 | 12/2013 | Hsu | |
| 2015/0084170 A1 | 3/2015 | Im | |
| 2015/0279804 A1* | 10/2015 | Raravikar | B23K 35/3033 |
| | | | 257/737 |
| 2015/0380377 A1 | 12/2015 | Uzoh | |
| 2016/0043047 A1 | 2/2016 | Shim et al. | |
| 2016/0093598 A1* | 3/2016 | Jo | H01L 23/481 |
| | | | 257/713 |
| 2016/0334845 A1* | 11/2016 | Mittal | H01L 23/49811 |
| 2017/0141083 A1 | 5/2017 | Prabhu et al. | |
| 2018/0019229 A1* | 1/2018 | Chen | H01L 25/0657 |
| 2019/0103379 A1* | 4/2019 | Yu | H01L 23/49838 |

OTHER PUBLICATIONS

Office Action from Chinese Patent Application No. 201780094473.4, mailed Feb. 5, 2024, 15 pgs.

* cited by examiner

US 11,978,727 B2

PACKAGE ON ACTIVE SILICON SEMICONDUCTOR PACKAGES

CROSS-REFERENCE TO RELATED APPLICATIONS

This patent application is a U.S. National Phase Application under 35 U.S.C. § 371 of International Application No. PCT/US2017/054038, filed on Sep. 28, 2017, the entire contents of which is hereby incorporated by reference herein.

TECHNICAL FIELD

The present disclosure relates to the fabrication of stacked package semiconductors.

BACKGROUND

Package-on-package (PoP) is an integrated circuit packaging technology in which a number of ball grid array (BGA) packages are arranged vertically. PoP packaging beneficially reduces the board area occupied by individually semiconductor packages. PoP packaging also minimizes track length between components that frequently interoperate. Minimizing track length provides more rapid signal propagation, reduced noise, and reduced channel cross-talk. In assembly, PoP packaging permits the testing of individual components prior to stacking rather than after stacking (e.g., chip stacking), reducing rework since only known good components are used in the PoP package.

In a typical PoP integrated circuit a memory package is stacked with a logic package, such as a system-on-a-chip (SoC). Frequently, the stacked packages are stacked and then physically and conductively coupled via reforming. Since most semiconductor packages create heat when operating, heat produced by the semiconductor packages in the stack must be dissipated through a relatively small area. The reduced heat transfer within a PoP package leads to the formation of hot spots within the stack and, ultimately, to premature failure of the PoP package.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
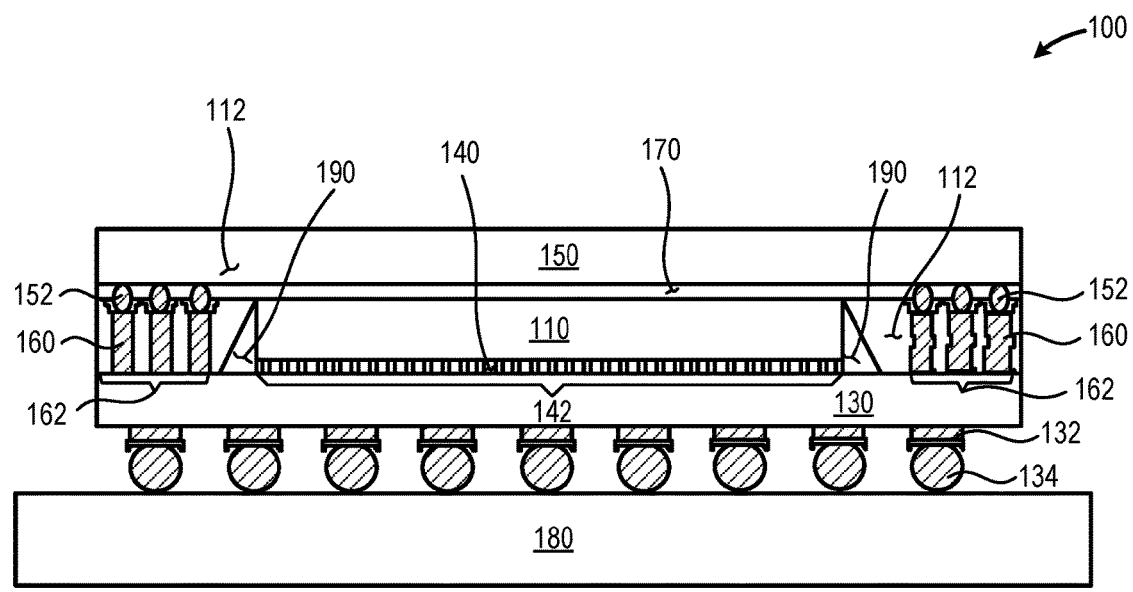
FIG. 1 is a cross-sectional elevation of an illustrative package-on-silicon (PoS) semiconductor package in which a first semiconductor package and a second semiconductor package are conductively coupled to an active silicon substrate that communicably couples the first semiconductor package to the second semiconductor package, in accordance with at least one embodiment described herein.

Although the following Detailed Description will proceed with reference being made to illustrative embodiments, many alternatives, modifications and variations thereof will be apparent to those skilled in the art.

DETAILED DESCRIPTION

The systems and methods disclosed herein provide for a package-on-silicon (PoS) semiconductor package in which a first semiconductor package and a second semiconductor package are stacked on and conductively coupled to an active silicon substrate. The active silicon substrate communicably couples the first semiconductor package to the second semiconductor package. Typically, the second semiconductor package is positioned above the first semiconductor package and the first semiconductor package conductively couples directly to the active silicon substrate using a plurality interconnects arranged in a first pattern.

In embodiments where the footprint of the second semiconductor package extends beyond the footprint of the first semiconductor package, a plurality of conductive members (e.g., copper clad pillars) may extend between and conductively couple conductive structures arranged in a second pattern on the upper surface of the active silicon substrate to conductive structures disposed on the lower surface of the second semiconductor package. In such embodiments, the interconnect pitch (i.e., the spacing and geometric arrangement) of the first pattern may have a density greater than the interconnect pitch of the second pattern. In such embodiments, the conductive members may be formed on the surface of the active silicon substrate prior to conductively coupling the second semiconductor package to the conductive members.

In other embodiments, a plurality of wirebonds may conductively couple the second semiconductor package to the active silicon substrate. In such embodiments, the pads or lands disposed in a second pattern across the surface of the active silicon substrate receive each of at least some of the wirebonds conductively coupled to the second semiconductor package. The active silicon substrate includes various conductors, electronic components, logic devices, and/or semiconductor devices to communicably couple the first semiconductor package to the second semiconductor package. In such embodiments, the interconnect pitch of the first pattern of interconnects coupling the first semiconductor package to the active silicon substrate may have a density greater than the interconnect pitch of the second pattern of pads or similar conductive structures coupling the second semiconductor package to the active silicon substrate. In such embodiments, the pads or other conductive structures may be formed on the surface of the active silicon substrate prior to conductively coupling the second semiconductor package to the conductive members.

In other embodiments, an interposer layer may be disposed between the upper surface of a first semiconductor package and the lower surface of the second semiconductor package. IN embodiments, the bottom surface of the interposer layer may be physically coupled, for example using a highly thermally conductive epoxy, to the first semiconductor package. The second semiconductor package conductively couples to the upper surface of the interposer layer. In some implementations, conductive lands, pads, or similar structures disposed across all or a portion of the lower surface of the interposer layer may conductively couple to the conductive structures extending from the surface of the active silicon substrate. In some implementations, wirebonds may conductively couple conductive lands, pads, or similar structures disposed across all or a portion of the upper surface of the interposer layer to conductive structures disposed in a second pattern across the surface of the active silicon substrate.

A package-on-silicon (PoS) semiconductor package is provided. The PoS semiconductor package may include: an active silicon substrate having: an upper surface; a lower surface; and a plurality of conductive structures disposed across the upper surface; where the plurality of conductive structures includes: a first portion of conductive structures disposed in a first pattern across the upper surface of the active silicon substrate; and a second portion of conductive structures disposed in a second pattern across the upper surface of the active silicon substrate; a first semiconductor package having an upper surface, a lower surface, and a plurality of conductive bumps disposed in the first pattern across the lower surface of the first semiconductor package; where the plurality of conductive bumps communicably couple the first semiconductor package to the first portion of conductive structures disposed on the active silicon substrate; and a second semiconductor package having an upper surface and a lower surface; the second semiconductor package disposed such that at least a portion of the first semiconductor package is disposed between the lower surface of the second semiconductor package and the upper surface of the active silicon substrate; and the second semiconductor package communicably coupled, via a plurality of conductive members, to at least some of the second portion of conductive structures disposed on the active silicon substrate, wherein the active silicon substrate communicably couples the first semiconductor package to the second semiconductor package.

A package-on-silicon (PoS) semiconductor package manufacturing method is provided. The method may include: conductively coupling each of a plurality of conductive structures disposed on a lower surface of a first semiconductor package to corresponding ones of a first portion of conductive structures disposed in a first pattern across an upper surface of an active silicon substrate; conductively coupling each of a plurality of conductive structures disposed on a second semiconductor package to corresponding ones of a second portion of conductive structures disposed in a second pattern across the upper surface of the active silicon substrate; where the second semiconductor package is operably coupled to the active silicon substrate such that at least a portion of the first semiconductor package is disposed between at least a portion of a lower surface of the second semiconductor package and the upper surface of the active silicon substrate; and communicably coupling the first semiconductor package to the second semiconductor package via the active silicon substrate.

An electronic device incorporating a package-on-silicon (PoS) semiconductor package is provided. The electronic device may include: a substrate having conductively coupled thereto a package-on-silicon (PoS) semiconductor package, the PoS semiconductor package including: an active silicon substrate having a plurality of conductive structures; where the plurality of conductive structures may include: a first portion of conductive structures disposed in a first pattern across at least a portion of an upper surface of the active silicon substrate; and a second portion of conductive structures disposed in a second pattern across at least a portion of the upper surface of the active silicon substrate; a first semiconductor package having an upper surface, a lower surface, and a plurality of conductive bumps disposed in the first pattern across at least a portion of the lower surface of the first semiconductor package; where the plurality of conductive bumps communicably couple the first semiconductor package to the first portion of conductive structures disposed on the upper surface of the active silicon substrate; and a second semiconductor package having an upper surface and a lower surface; the second semiconductor package disposed above the upper surface of the first semiconductor package; and the second semiconductor package communicably coupled, via a plurality of conductive members, to at least some of the second portion of conductive structures disposed on the upper surface of the active silicon substrate; where the active silicon substrate communicably couples the first semiconductor package to the second semiconductor package.

A package-on-silicon (PoS) semiconductor package manufacturing system is provided. The system may include: means for conductively coupling each of a plurality of conductive structures disposed on a lower surface of a first semiconductor package to corresponding ones of a first portion of conductive structures disposed in a first pattern across an upper surface of an active silicon substrate; means for conductively coupling each of a plurality of conductive structures disposed on a second semiconductor package to corresponding ones of a second portion of conductive structures disposed in a second pattern across the upper surface of the active silicon substrate; where the second semiconductor package is operably coupled to the active silicon substrate such that at least a portion of the first semiconductor package is disposed between at least a portion of a lower surface of the second semiconductor package and the upper surface of the active silicon substrate; and communicably coupling the first semiconductor package to the second semiconductor package via the active silicon substrate.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

As used herein, the term "logically associated" when used in reference to a number of objects, systems, or elements, is intended to convey the existence of a relationship between the objects, systems, or elements such that access to one object, system, or element exposes the remaining objects, systems, or elements having a "logical association" with or to the accessed object, system, or element. An example "logical association" exists between relational databases where access to an element in a first database may provide information and/or data from one or more elements in a number of additional databases, each having an identified relationship to the accessed element. In another example, if "A" is logically associated with "B," accessing "A" will expose or otherwise draw information and/or data from "B," and vice-versa.

FIG. 1 is a cross-sectional elevation of an illustrative package-on-silicon (PoS) semiconductor package 100 in which a first semiconductor package 110 and a second semiconductor package 150 are stacked and conductively coupled to an active silicon substrate 130 that communicably couples the first semiconductor package 110 to the second semiconductor package 150, in accordance with at least one embodiment described herein. The first semiconductor package 110 conductively couples to an active silicon substrate 130 using a plurality of interconnects 140 disposed in a first pattern 142 across the upper surface of the active silicon substrate 130. The second semiconductor package 150 also conductively couples to the active silicon substrate 130 using a plurality of conductive structures 160 (e.g., conductive pillars) that extend from an upper surface of the active silicon substrate 130 and are disposed in a second pattern 162 across the upper surface of the active silicon substrate 130. In embodiments, the density of the first interconnect pattern 142 is greater than the density of the second interconnect pattern 162. In embodiments, the inter-interconnect distance (i.e., the distance between interconnects 140) in the first interconnect pattern 142 is less than the inter-interconnect distance (i.e., the distance between conductive structures 160) in the second interconnect pattern 162.

The active silicon substrate 130 communicably couples the first semiconductor package 110 to the second semiconductor package 150. In embodiments, lands, pads, or similar conductive elements 132 may be disposed on, across, or about all or a portion of the lower surface of the active silicon substrate 130. Conductive material, such as a conductive paste or solder balls 134 may communicably couple the active silicon substrate 130 to an underlying organic substrate 180, such as a printed circuit board. The active silicon substrate 130 may include any number of conductively coupled, connected, and/or configurable circuits, electrical components, conductive structures, logic elements, and/or semiconductor devices. The active silicon substrate 130 may include any number and/or combination of conductive and/or dielectric layers. The active silicon substrate 130 communicably couples the first semiconductor package 110 to the second semiconductor package 150. The active silicon layer 130 may have a height of less than: about 50 micrometers (μm); about 75 μm; about 100 μm; about 125 μm; about 150 μm; about 175 μm; or about 200 μm. The conductive elements 132 conductively coupling the active silicon layer 130 to the underlying organic substrate may have a height of less than: about 50 micrometers (μm); about 75 μm; about 100 μm; about 125 μm; about 150 μm; about 175 μm; or about 200 μm.

In embodiments, the first semiconductor package 110 conductively couples to the active silicon substrate 130 using interconnects 140 arranged in a first interconnect pattern 142. In embodiments, the lands, pads, bumps, or similar conductive elements 140 arranged in the first interconnect pattern 142 may be disposed in on, about, or across the upper surface of the active silicon substrate 130. In embodiments, the lands, pads, bumps, or similar conductive elements 140 forming the first interconnect pattern 142 may be spaced at a distance of: less than about 100 micrometers (μm); less than about 80 μm; less than about 60 μm; less than about 50 μm; less than about 40 μm; less than about 30 μm; less than about 20 μm; or less than about 10 μm.

In embodiments, the second semiconductor package 150 conductively couples to the active silicon substrate using conductive members 160 arranged in a second interconnect pattern 162. In embodiments, the conductive members 160 arranged in the second interconnect pattern 162 may be disposed in on, about, or across the upper surface of the active silicon substrate 130. In embodiments, the conductive members 160 forming the second interconnect pattern 162 may be spaced at a distance of: greater than about 100 micrometers (μm); greater than about 120 μm; greater than about 140 μm; greater than about 150 μm; greater than about 170 μm; greater than about 190 μm; greater than about 200 μm; or greater than about 220 μm. In some implementations, the conductive members 160 may be formed on, about, or across the upper surface of the active silicon substrate 130 using any current or future developed deposition technique. In some implementations, the conductive members 160 may include, but are not limited to, a copper plated member conductively coupled to the upper surface of the active silicon substrate 130. In embodiments, the conductive members 160 may have a height (i.e., may project from the upper surface of the active silicon substrate 130 a distance) of: about 50 micrometers (μm); about 60 μm; about 70 μm; about 80 μm; about 90 μm; about 100 μm; about 110 μm; about 120 μm; about 130 μm; about 140 μm; or about 150 μm.

The first semiconductor package 110 may include any number and/or combination of semiconductor dies and/or stacked semiconductor dies having a first, high density, interconnect pattern 142 disposed across all or a portion of the bottom surface of the first semiconductor package 110. In embodiments, a plurality of micro bumps 140 may provide the first interconnect pattern 142 on the bottom surface of the first semiconductor package 110. In embodiments, the first semiconductor package 110 may include a system-on-a-chip (SoC) semiconductor package, such as an Atom® SoC available from Intel®, Corp. (SANTA CLARA, California). The first semiconductor package 110 may include one or more semiconductor packages used in rack-mounted, desktop, or portable processor-based devices. In at least some implementations, one or more materials may be underflowed 190 in the space between the bottom surface of the first semiconductor package 110 and the upper surface of the active silicon substrate 130. In embodiments, the first semiconductor package 110 may have a height of less than: about 50 micrometers (μm); about 75 μm; about 100 μm; about 125 μm; about 150 μm; or about 200 μm.

The second semiconductor package 150 may include any number and/or combination of semiconductor dies and/or stacked semiconductor dies having a second interconnect pattern 162 disposed across all or a portion of a peripheral portion of the bottom surface of the second semiconductor package 150 that overhangs and/or extends beyond the periphery of the first semiconductor package 110. In embodiments, the second semiconductor package 150 may include, but is not limited to: one or more memory and/or storage semiconductor packages; one or more graphics/graphical processor semiconductor packages; and/or one or more wired or wireless communications interface semiconductor packages.

As depicted in FIG. 1, the lower surface of the second semiconductor package 150 may be physically affixed, coupled, and/or bonded to the upper surface of the first semiconductor package using one or more chemically active or thermosetting adhesives, such as a high thermal conductivity adhesive 170 that promotes the flow of heat upward through the PoS package. In embodiments, the high thermal conductivity adhesive 170 may have a height (i.e., depth measured from the lower surface of the second semiconductor package 150 to the upper surface of the first semiconductor package 110) of less than: about 5 micrometers (μm); about 10 μm; about 15 μm; about 20 μm; about 25 μm; or about 30 μm.

In embodiments, the second semiconductor package 150 may include a plurality of conductive features, such as a plurality of solder balls 152, that, when reflowed, conductively couple the second semiconductor package 150 to the conductive members 160 extending from the upper surface of the active silicon substrate. In embodiments, a mold compound 112 may be inserted, deposited, flowed, or otherwise disposed between the lower surface of the second semiconductor package 150 and the upper surface of the active silicon substrate 130.

Figure 2:
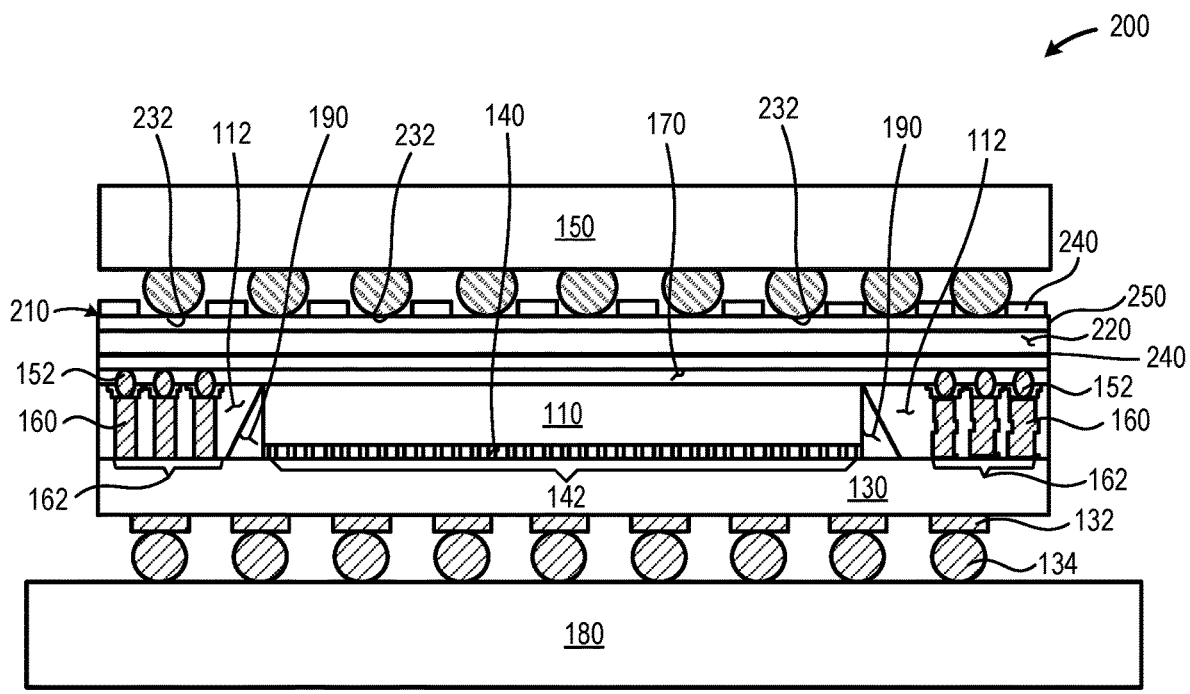
FIG. 2 is a cross-sectional elevation of an illustrative package-on-silicon (PoS) semiconductor package that includes a first semiconductor package and a second semiconductor package stacked and physically coupled using an interposer layer disposed between the upper surface of the first semiconductor package and the lower surface of the second semiconductor package, in accordance with at least one embodiment described herein.

FIG. 2 is a cross-sectional elevation of an illustrative package-on-silicon (PoS) semiconductor package 200 that includes a first semiconductor package 110 and a second semiconductor package 150 stacked and physically coupled using an interposer layer 210 disposed between the upper surface of the first semiconductor package 110 and the lower surface of the second semiconductor package 150, in accordance with at least one embodiment described herein. The first semiconductor package 110 conductively couples to an active silicon substrate 130 using a plurality of interconnects 140 disposed in a first pattern 142 across the upper surface of the active silicon substrate 130. The second semiconductor package 150 includes a ball grid array package that conductively couples to a plurality of lands, pads, or similar conductive features 232 disposed on, about, or across the upper surface of the interposer layer 210. The interposer layer 210 includes a plurality of conductive features, such as a plurality of solder balls 222, that, when reflowed, conductively couple the interposer layer 210 (and, hence, the second semiconductor package 150) to the conductive members 160 extending from the upper surface of the active silicon substrate 130.

The interposer layer 210 translates the contact pattern or pitch on the lower surface of the second semiconductor package 150 to the second interconnect pattern 162, thereby beneficially enabling the use of BGA and similar second semiconductor packages 150 in the PoS semiconductor package 200. In some implementations, the interposer layer 210 includes an organic pitch redistribution layer 220 sandwiched between an upper conductive layer 230 that includes and/or incorporates the conductive features 232 and a lower conductive layer 240 that includes and/or incorporates the plurality of solder balls 222 used to conductively couple the interposer layer 210 to the conductive members 160. As depicted in FIG. 2, the lower surface of the interposer layer 210 may be physically affixed, coupled, and/or bonded to the upper surface of the first semiconductor package using one or more chemically active or thermosetting adhesives, such as a high thermal conductivity adhesive 170 that promotes the flow of heat transversely and upwardly through the PoS package 200. In embodiments, the interposer layer 210 may have a height of less than: about 20 micrometers (μm); about 30 μm; about 40 μm; about 50 μm; about 60 μm; about 70 μm; or about 80 μm.

Figure 3:
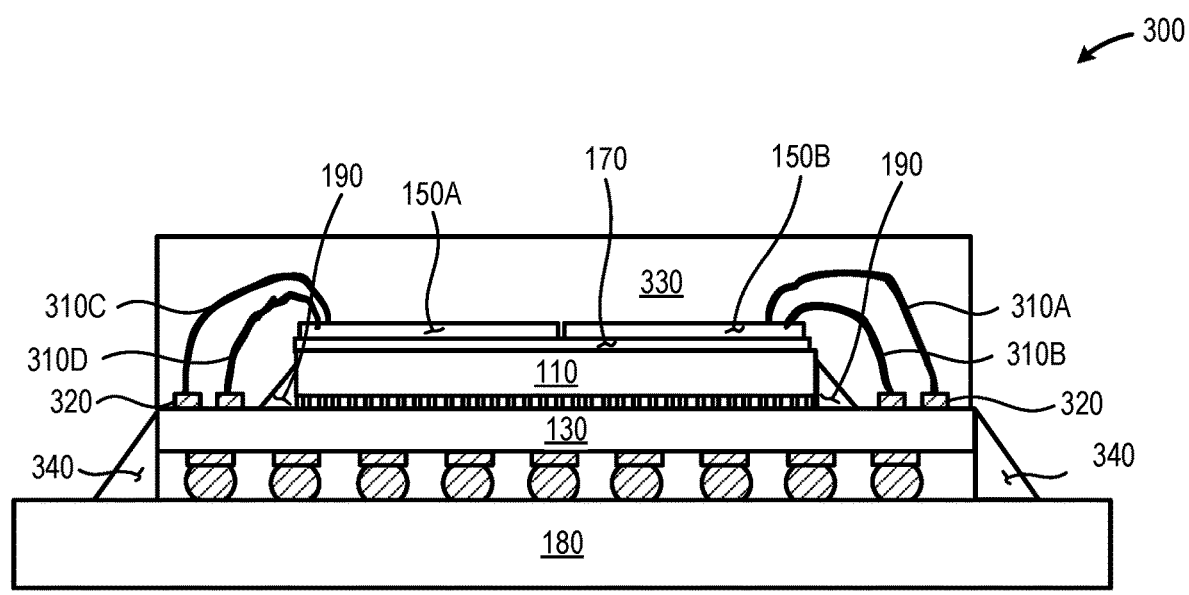
FIG. 3 is a cross-sectional elevation of an illustrative package-on-silicon (PoS) semiconductor package that includes a stacked first semiconductor package physically coupled to at least one second semiconductor package that is communicably coupled via a plurality of wirebonds to an active silicon substrate, in accordance with at least one embodiment described herein.

FIG. 3 is a cross-sectional elevation of an illustrative package-on-silicon (PoS) semiconductor package 300 that includes a stacked first semiconductor package 110 physically coupled to at least one second semiconductor package 150 that is communicably coupled via a plurality of wirebonds 310A-310n (collectively, "wirebonds 310") to an active silicon substrate 130, in accordance with at least one embodiment described herein. As depicted in FIG. 3, the first semiconductor package 110 conductively couples to an active silicon substrate 130 using a plurality of interconnects 140 disposed in a first pattern 142 across the upper surface of the active silicon substrate 130. As depicted in FIG. 3, the at least one second semiconductor package 150 may include a plurality of second semiconductor Devices 150A-150n (collectively, "second semiconductor packages or devices 150") each of which physically attaches or couples to the upper surface of the first semiconductor package 110 using one or more chemically activated or thermosetting adhesives 170.

As depicted in FIG. 3, each of the at second semiconductor device 150A and 150B conductively couples to the active silicon substrate 130 via a plurality of wirebonds 310A-310n, each of which extend from conductive features disposed on the upper surface of the second semiconductor packages or devices 150 to a respective conductive pad 320A-320n disposed in the second interconnect pattern on, across, or about the upper surface of the active silicon substrate 130. In embodiments, such as depicted in FIG. 3, an underflow material 340 may be disposed between the lower surface of the active silicon substrate 130 and the upper surface of the organic substrate 180 to which the PoS semiconductor package 300A is coupled. In embodiments, such as depicted in FIG. 3, a molding compound 330 may be disposed at least partially about the first semiconductor package 110 and the second semiconductor package 150.

Figure 4A:
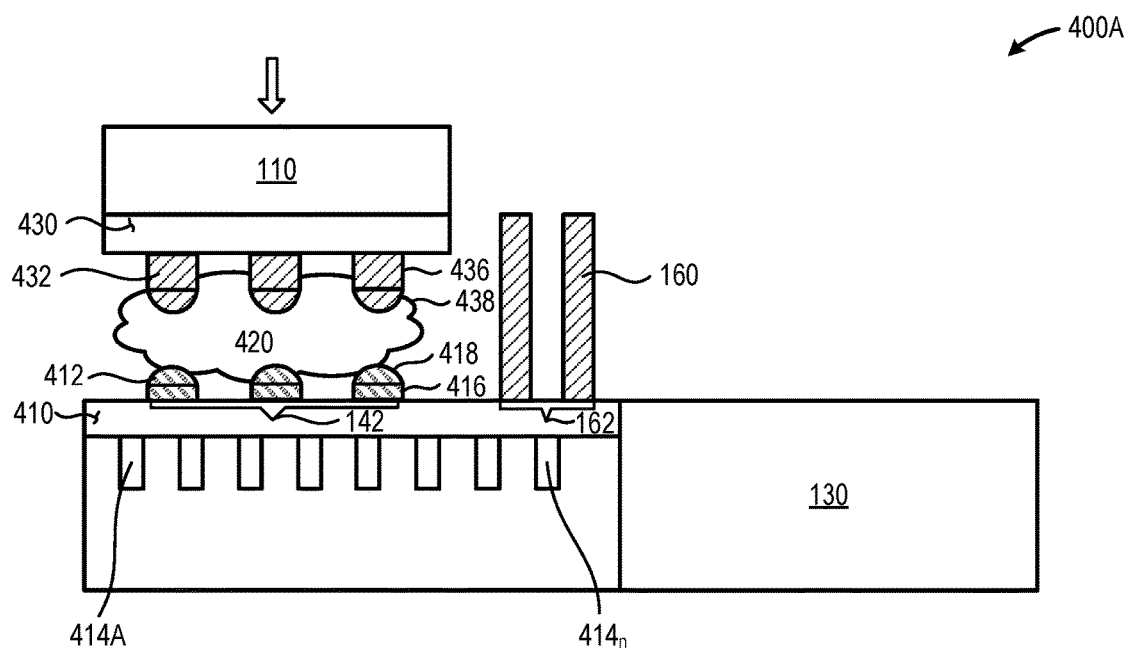
FIG. 4A depicts an illustrative process for coupling the first semiconductor package to the active semiconductor substrate, in accordance with at least one embodiment described herein.

FIGS. 4A-4H depict an illustrative process for fabricating a package-on-silicon (PoS) semiconductor package, in accordance with at least one embodiment described herein. FIG. 4A depicts an illustrative process 400A for coupling the first semiconductor package 110 to the active semiconductor substrate 130, in accordance with at least one embodiment described herein. As depicted in FIG. 4A, the active semiconductor substrate 130 may include plurality of devices such as electrical components, conductors, logic elements, and semiconductor devices 410, such as semiconductor transistors. A plurality of through silicon vias (TSVs) 414A-414n may extend into the active silicon substrate 130. A plurality of conductive elements 412 may extend upwardly from an upper surface of the active silicon substrate 130. In embodiments, each of some or all of the conductive elements 412 may include a nickel post 416 capped with a thin solder bump 418. In embodiments, the conductive elements 412 may be disposed in the first interconnect pattern 142.

A plurality of conductive structures 160A-160n (collectively, "conductive structures 160"), are formed, deposited, or otherwise disposed in the second interconnect pattern 162 on the upper surface of the active silicon substrate 130. In embodiments, the conductive structures 160 may be formed using any currently available or future developed material deposition process, such as electro-plating or photolithographic deposition. In embodiments, the conductive structures 160 may be pre-formed and attached to the upper surface of the active silicon substrate 130, for example via solder or via an electrically conductive adhesive. The conductive structures 160 may be formed using any electrically conductive material, such as: copper or copper containing alloy; aluminum or an aluminum containing alloy; a conductive polymer; or combinations thereof. In embodiments, the conductive structures 160 may have the same or differing heights. The conductive structures 160 may have a height of greater than: about 50 micrometers (μm); about 75 μm; about 100 μm; about 125 μm; about 150 μm; about 175 μm; or about 200 μm.

The first semiconductor package 110 includes electronic components, circuits, conductors, logic elements, and semiconductor devices 430, such as semiconductor transistors. The first semiconductor package 110 also includes a number of conductive elements 432 arranged or disposed in the first interconnect pattern 142 on the lower surface of the first semiconductor package 110. In embodiments, each of some or all of the conductive elements 432 may include a nickel post 436 capped with a thin solder bump 438. An epoxy flux 420 may be used to facilitate the conductive coupling of the first semiconductor package 110 to the active silicon substrate 130.

In embodiments, the solder 438 on the conductive elements 432 attached to the first semiconductor package 110 melts and combines with the solder 418 on the conductive elements 412 attached to the active silicon substrate 130 to form the interconnects 140 that conductively couple the first semiconductor package 110 to the active silicon substrate 130. In some implementations, the cured epoxy flux 420 remains between the lower surface of the first semiconductor package 110 and the upper surface of the active silicon substrate 130 to provide an underfill for the first semiconductor package 110.

Figure 4B:
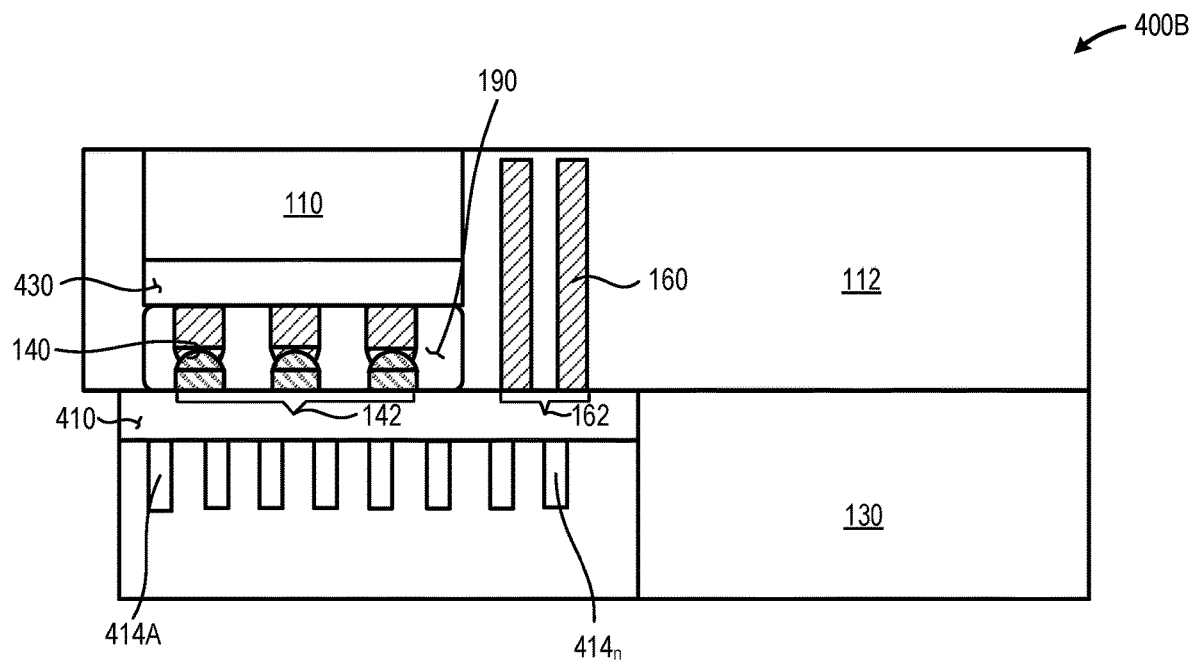
FIG. 4B depicts an illustrative process for encasing the first semiconductor package in a molding compound, in accordance with at least one embodiment described herein.

FIG. 4B depicts an illustrative process 400B for encasing the first semiconductor package 110 in a molding compound 112, in accordance with at least one embodiment described herein. As depicted in FIG. 4B a molding compound 112 may be disposed partially or completely about the first semiconductor package 110. In embodiments, the top surface of the molding compound may be approximately level with the upper surface of the first semiconductor package 110. In embodiments, the conductive structures 160 may be covered by and/or encased in molding compound 112.

Figure 4C:
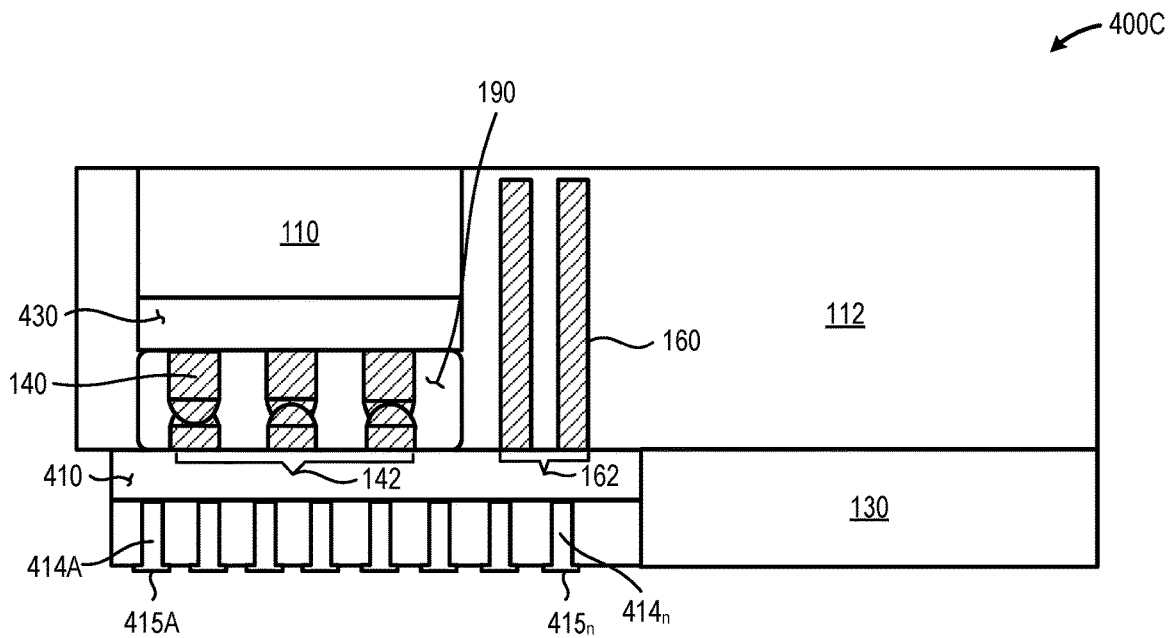
FIG. 4C depicts an illustrative process in which the active silicon substrate has been thinned, to expose the through silicon vias, in accordance with at least one embodiment described herein.

FIG. 4C depicts an illustrative process 400C in which the active silicon substrate 130 has been thinned, to expose the through silicon vias (TSVs) 412A-412n (collectively, "TSVs 412"), in accordance with at least one embodiment described herein. Each of at least some of the TSVs 412 terminate in a respective conductive bumps 415A-415n (collectively, "conductive bumps 415") disposed on the lower surface of the active silicon substrate 130. The active silicon substrate 130 may be thinned using any currently available or future developed thinning method or process, such as chemical/mechanical planarization (CMP). In embodiments, the conductive bumps 415 may be disposed, deposited, or otherwise formed proximate each of the TSVs 412 using any currently available or future developed deposition technology, process, or method. For example, the conductive elements 415 may be photolithographically deposited or electroplated on the lower surface of the active silicon substrate 130.

Figure 4D:
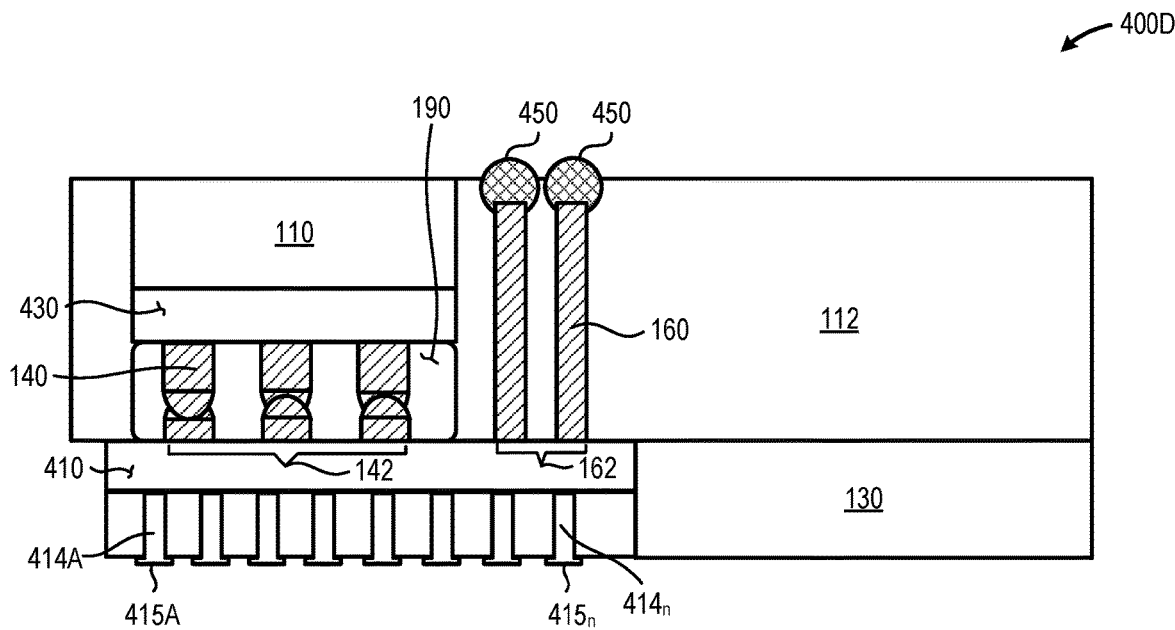
FIG. 4D depicts an illustrative process in which the molding compound proximate the conductive members has been removed, exposing the conductive members and solder balls have been physically and conductively coupled to at least some of the conductive members, in accordance with at least one embodiment described herein.

FIG. 4D depicts an illustrative process 400D in which the molding compound 112 proximate the conductive members 160 has been removed, exposing the conductive members 160 and solder balls 450 have been physically and conductively coupled to at least some of the conductive members 160, in accordance with at least one embodiment described herein. In embodiments, the molding compound 112 proximate at least some of the conductive members 160 may be removed using any currently available or future developed material removal technology, process, or method. For example, the molding compound 112 proximate the end of some or all of the conductive members 160 may be removed via laser ablation.

In embodiments, a shallow through mold interconnect (TMI) is formed above each of the conductive members 160, exposing the distal (referenced to the active silicon substrate 130) end of the respective conductive member. The TMI and conductive member 160 are cleaned, a solder paste is applied or printed onto the upper surface of the molding compound 112 and reflowed into the TMI, forming the solder ball 450 that is physically and conductively coupled to the respective conductive member 160.

Figure 4E:
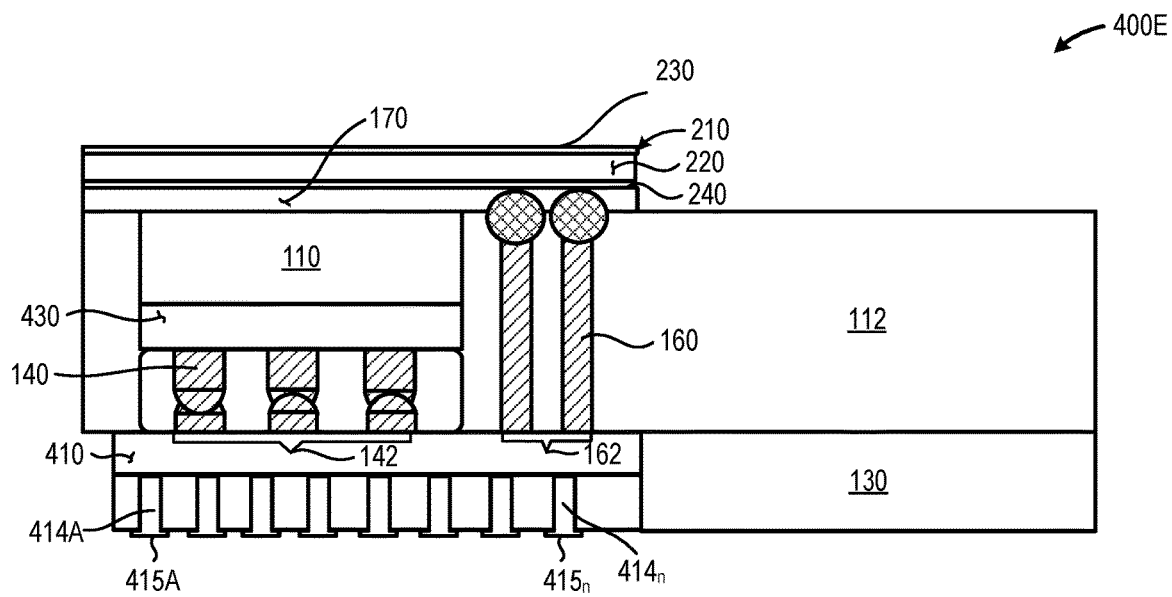
FIG. 4E depicts an illustrative process in which an interposer layer has been physically coupled to the upper surface of the first semiconductor package by a high thermal conductivity epoxy flux, in accordance with at least one embodiment described herein.

FIG. 4E depicts an illustrative process 400E in which an interposer layer 210 has been physically coupled to the upper surface of the first semiconductor package 110 by a high thermal conductivity epoxy flux 170, in accordance with at least one embodiment described herein. The interposer layer 210 includes an organic pitch redistribution layer 220 sandwiched between an upper conductive layer 230 and a lower conductive layer 240 that conductively couples to the solder balls 250 formed on the end of the conductive members 160.

Figure 4F:
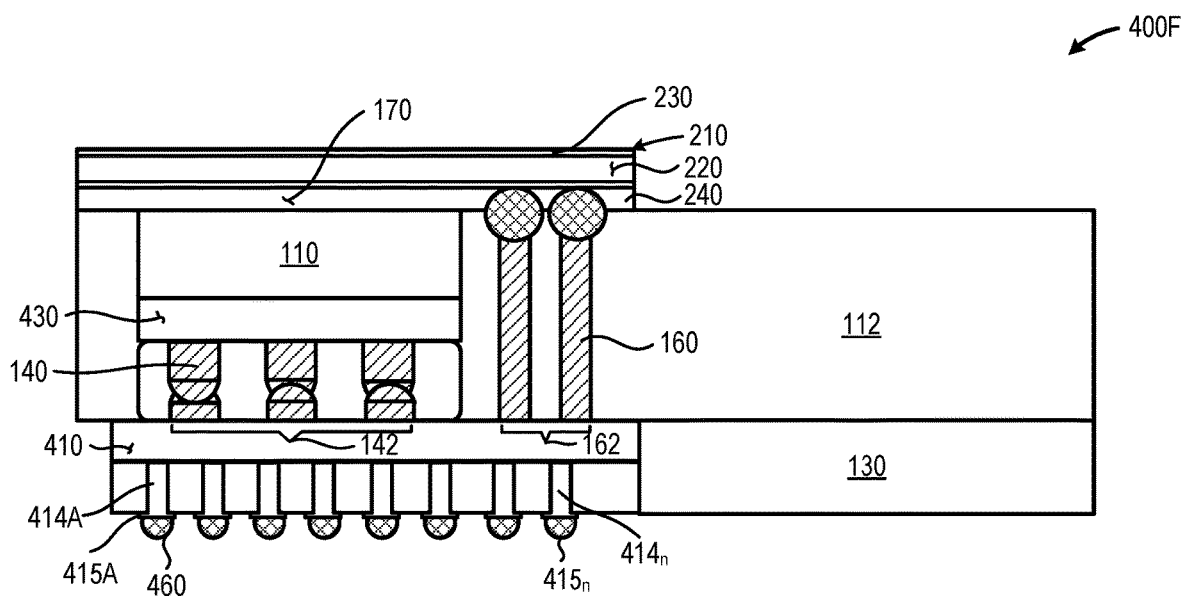
FIG. 4F depicts an illustrative process in which solder balls have been reflowed onto the conductive bumps disposed on the lower surface of the active silicon substrate, in accordance with at least one embodiment described herein.

FIG. 4F depicts an illustrative process 400F in which solder balls 460 have been reflowed onto the conductive bumps 415 disposed on the lower surface of the active silicon substrate 130, in accordance with at least one embodiment described herein. Although reflowed solder balls 460 are depicted in FIG. 4F, any similar conductive elements may be disposed proximate each of at least some of the conductive bumps 415 disposed on the lower surface of the active silicon substrate 130.

Figure 4G:
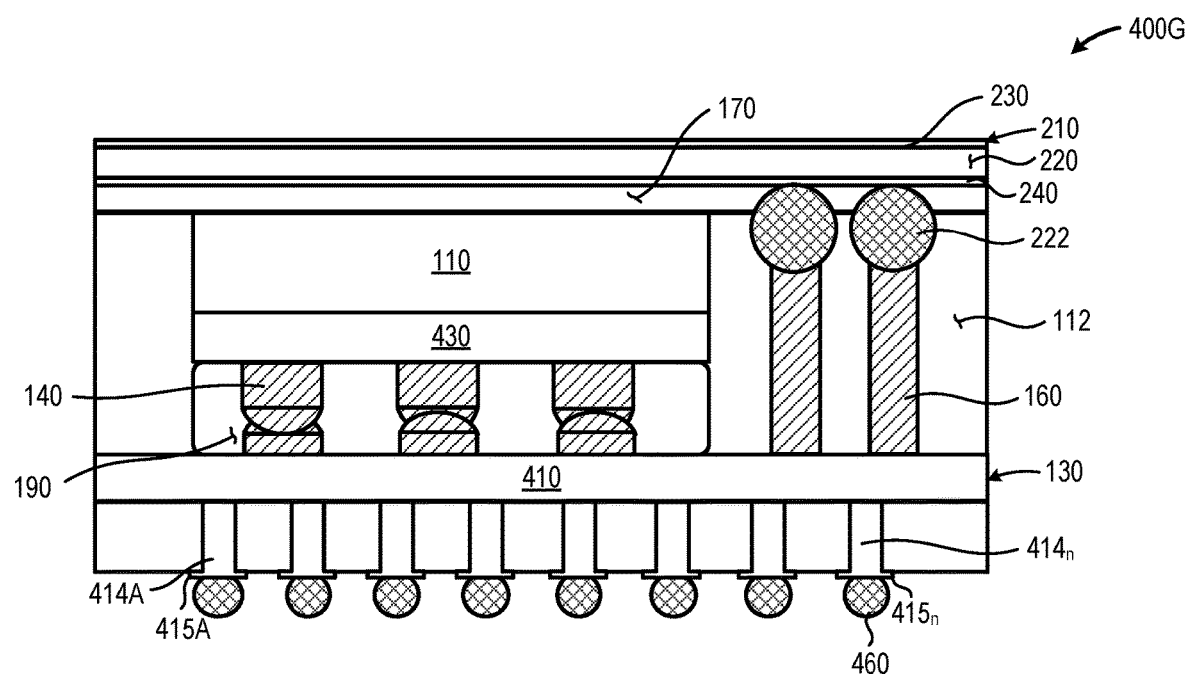
FIG. 4G depicts an illustrative process in which the package-on-silicon (PoS) semiconductor package has been singulated, in accordance with at least one embodiment described herein.

FIG. 4G depicts an illustrative process 400G in which the package-on-silicon (PoS) semiconductor package has been singulated, in accordance with at least one embodiment described herein. The PoS semiconductor package 400G may be singulated using any currently available or future developed singulation technique, method, or process. For example, in some implementations, the PoS semiconductor package 400G may be singulated using a mechanical or abrasive saw.

Figure 4H:
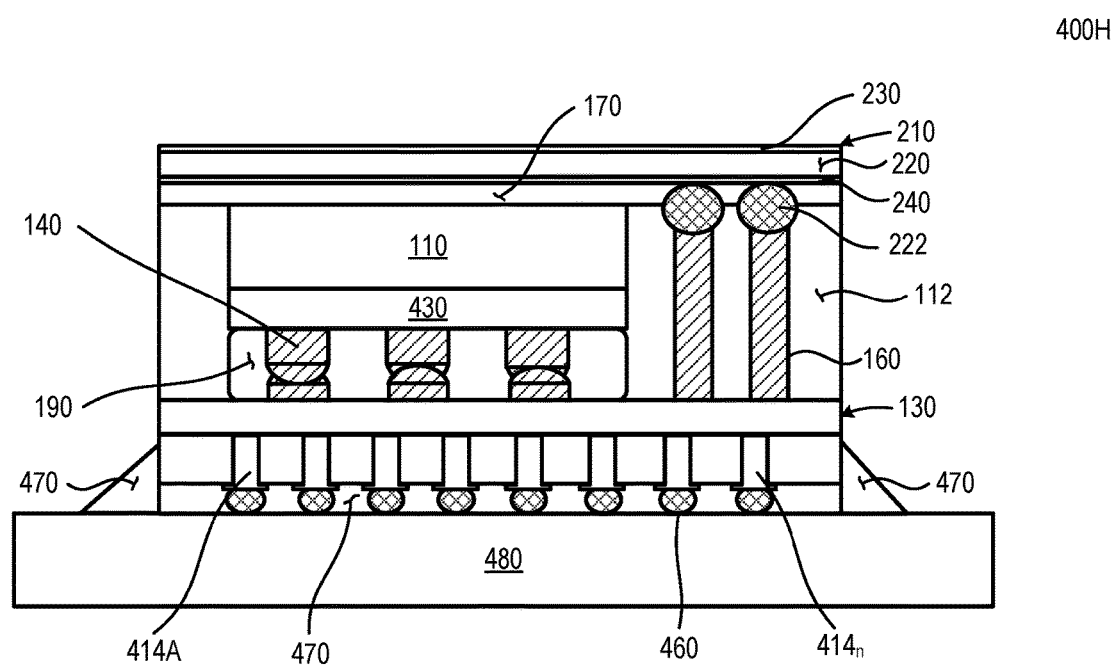
FIG. 4H depicts an illustrative process in which the active silicon substrate of the singulated package-on-silicon (PoS) semiconductor package has been conductively coupled to a substrate by reflowing the solder balls disposed on the lower surface of the active silicon substrate, in accordance with at least one embodiment described herein.

FIG. 4H depicts an illustrative process 400H in which the active silicon substrate of the singulated package-on-silicon (PoS) semiconductor package has been conductively coupled to a substrate 480 by reflowing the solder balls 460 disposed on the lower surface of the active silicon substrate 130, in accordance with at least one embodiment described herein. In embodiments, an underfill material 470 may be flowed between the lower surface of the active silicon substrate 130 and the upper surface of the substrate 480. In embodiments, the substrate 480 may include a printed circuit board having a plurality of layers of a high-density substrate.

Figure 5A:
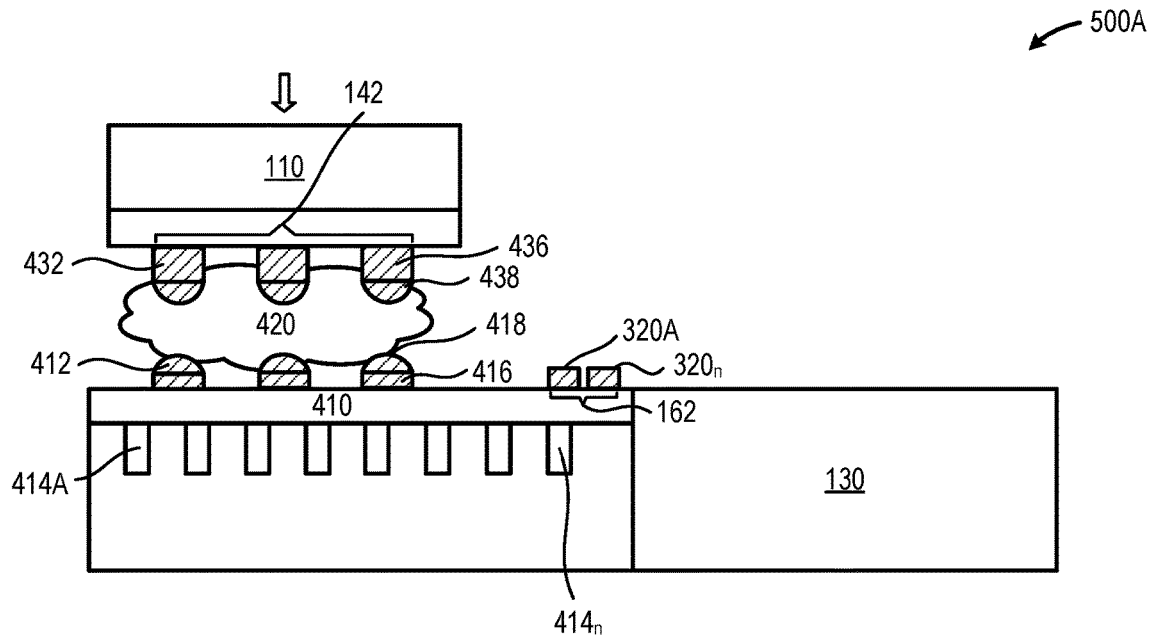
FIG. 5A depicts an illustrative process for coupling a first semiconductor package to the active semiconductor substrate, in accordance with at least one embodiment described herein.

FIGS. 5A-5F depict an illustrative process for fabricating a package-on-silicon (PoS) semiconductor package in which a plurality of wirebonds 310 communicably couple a second semiconductor package 150 to an active silicon substrate 130, in accordance with at least one embodiment described herein. FIG. 5A depicts an illustrative process 500A for coupling a first semiconductor package 110 to the active semiconductor substrate 130, in accordance with at least one embodiment described herein. As depicted in FIG. 5A, the active semiconductor substrate 130 may include plurality of devices such as electrical components, conductors, logic elements, and semiconductor devices 410, such as semiconductor transistors. A plurality of through silicon vias (TSVs) 414A-414n may extend into the active silicon substrate 130. A plurality of conductive elements 412 may extend upwardly from an upper surface of the active silicon substrate 130. In embodiments, each of some or all of the conductive elements 412 may include a nickel post 416 capped with a thin solder bump 418. In embodiments, the conductive elements 412 may be disposed in the first interconnect pattern 142.

A plurality of conductive pads 320A-320n (collectively, "conductive pads 320"), are formed, deposited, or otherwise disposed in the second interconnect pattern 162 on the upper surface of the active silicon substrate 130. In embodiments, the conductive pads 320 may be formed using any currently available or future developed material deposition process, such as electro-plating or photolithographic deposition. The conductive pads 320 may be formed using any electrically conductive material, such as: copper or copper containing alloy; aluminum or an aluminum containing alloy; a conductive polymer; or combinations thereof.

The first semiconductor package 110 includes electronic components, circuits, conductors, logic elements, and semiconductor devices 430, such as semiconductor transistors. The first semiconductor package 110 also includes a number of conductive elements 432 arranged or disposed in the first interconnect pattern 142 on the lower surface of the first semiconductor package 110. In embodiments, each of some or all of the conductive elements 432 may include a nickel post 436 capped with a thin solder bump 438. An epoxy flux 420 may be used to facilitate the conductive coupling of the first semiconductor package 110 to the active silicon substrate 130.

In embodiments, the solder 438 on the conductive elements 432 attached to the first semiconductor package 110 melts and combines with the solder 418 on the conductive elements 412 attached to the active silicon substrate 130 to form the interconnects 140 that conductively couple the first semiconductor package 110 to the active silicon substrate 130. In some implementations, the cured epoxy flux 420 remains between the lower surface of the first semiconductor package 110 and the upper surface of the active silicon substrate 130 to provide an underfill for the first semiconductor package 110.

Figure 5B:
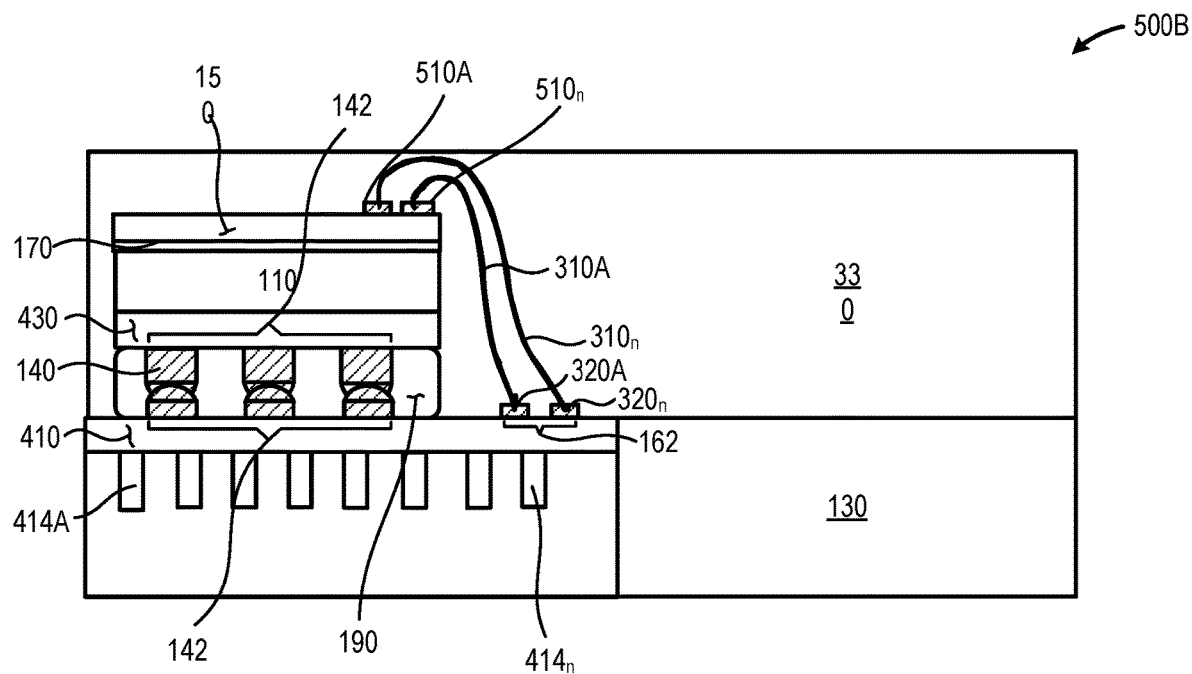
FIG. 5B depicts an illustrative process for conductively coupling a second semiconductor package to the active silicon substrate via a plurality of wirebonds and encasing the resultant package-on-silicon (PoS) semiconductor package in a molding compound, in accordance with at least one embodiment described herein.

FIG. 5B depicts an illustrative process 500B for conductively coupling a second semiconductor package 150 to the active silicon substrate 130 via a plurality of wirebonds 310A-310n (collectively, "wirebonds 310") and encasing the resultant package-on-silicon (PoS) semiconductor package in a molding compound 330, in accordance with at least one embodiment described herein. The second semiconductor package 150 may include one or more semiconductor packages physically coupled to the upper surface of the first semiconductor package 110 using a bonding agent, such as a high thermal conductivity (Hi-K) epoxy 170. A first end of each of a plurality of wirebonds 310 are conductively coupled to a respective conductive pad 510A-510n (collectively, "conductive pads 510") disposed on, across, or about at least a portion of the upper surface of the second semiconductor package 150. The second end of each of the plurality of wirebonds 310 is conductively coupled to a respective conductive pad 320A-320n disposed in the second interconnect pattern on the upper surface of the active silicon substrate 130.

Also as depicted in FIG. 5B a molding compound 330 may be disposed on, about or across at least a portion of the upper surface of the active silicon substrate 130 such that the molding compound 330 at least partially surrounds and/or covers the stacked first semiconductor package 110, second semiconductor package 150 and the wirebonds 310. In embodiments, the molding compound may include a high thermal conductivity molding compound 330. In such embodiments, the high thermal conductivity molding compound 330 may have a thermal conductivity of greater than: about 2 Watts/meter-Kelvin (W/m-K); about 3 W/m-K; about 4 W/m-K; about 5 W/m-K; about 7 W/m-K; about 10 W/m-K; or about 15 W/m-K.

Figure 5C:
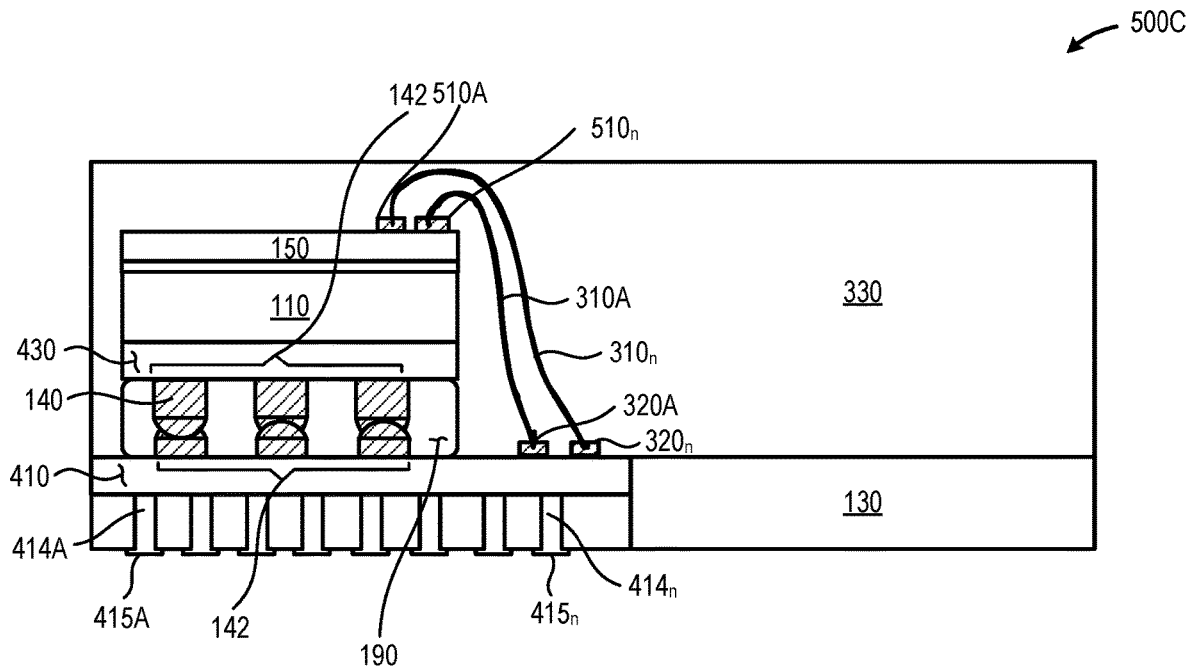
FIG. 5C depicts an illustrative process in which the active silicon substrate has been thinned, to expose the through silicon vias (TSVs), in accordance with at least one embodiment described herein.

FIG. 5C depicts an illustrative process 500C in which the active silicon substrate 130 has been thinned, to expose the through silicon vias (TSVs) 412A-412n (collectively, "TSVs 412"), in accordance with at least one embodiment described herein. Each of at least some of the TSVs 412 terminate in a respective conductive bumps 415A-415n (collectively, "conductive bumps 415") disposed on the lower surface of the active silicon substrate 130. The active silicon substrate 130 may be thinned using any currently available or future developed thinning method or process, such as chemical/mechanical planarization (CMP). In embodiments, the conductive bumps 415 may be disposed, deposited, or otherwise formed proximate each of the TSVs 412 using any currently available or future developed deposition technology, process, or method. For example, the conductive elements 415 may be photolithographically deposited or electroplated on the lower surface of the active silicon substrate 130.

Figure 5D:
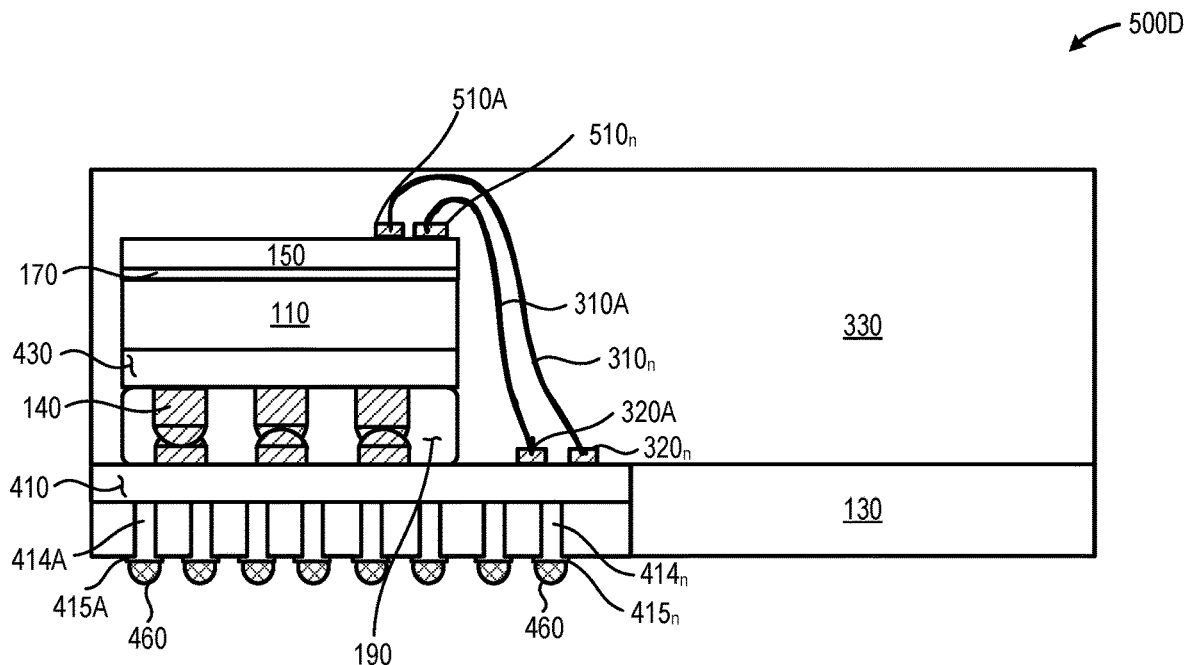
FIG. 5D depicts an illustrative process in which solder balls have been reflowed onto the conductive bumps disposed on the lower surface of the active silicon substrate, in accordance with at least one embodiment described herein.

FIG. 5D depicts an illustrative process 500D in which solder balls 460 have been reflowed onto the conductive bumps 415 disposed on the lower surface of the active silicon substrate 130, in accordance with at least one embodiment described herein. Although reflowed solder balls 460 are depicted in FIG. 5D, any similar conductive elements may be disposed proximate each of at least some of the conductive bumps 415 disposed on the lower surface of the active silicon substrate 130.

Figure 5E:
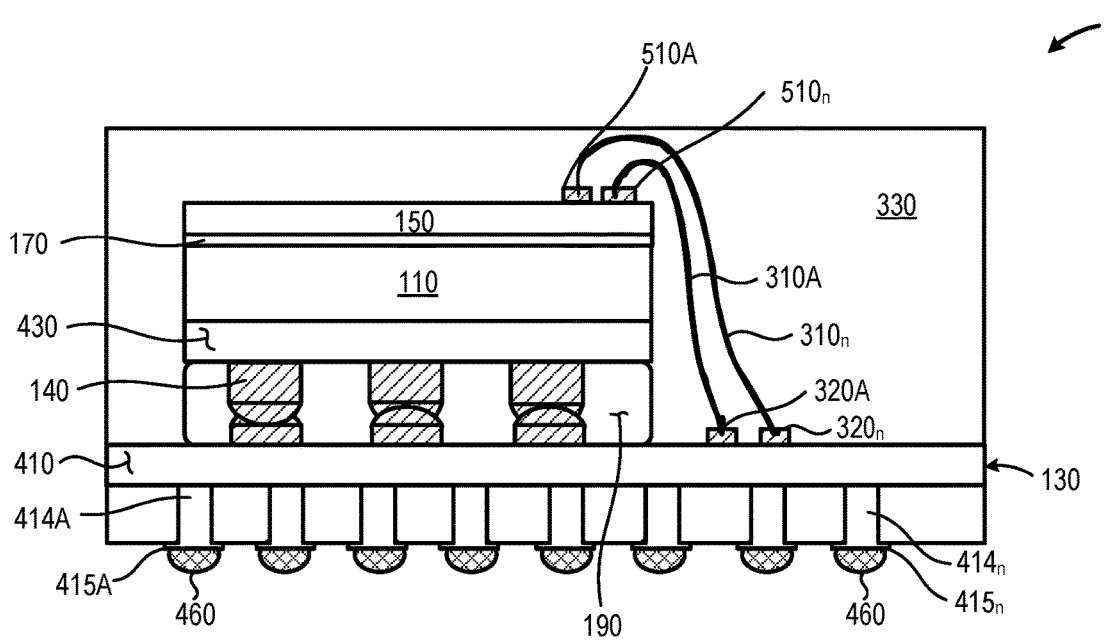
FIG. 5E depicts an illustrative process in which the package-on-silicon (PoS) semiconductor package has been singulated, in accordance with at least one embodiment described herein.

FIG. 5E depicts an illustrative process 500E in which the package-on-silicon (PoS) semiconductor package has been singulated, in accordance with at least one embodiment described herein. The PoS semiconductor package may be singulated using any currently available or future developed singulation technique, method, or process. For example, in some implementations, the PoS semiconductor package may be singulated using a mechanical or abrasive saw.

Figure 5F:
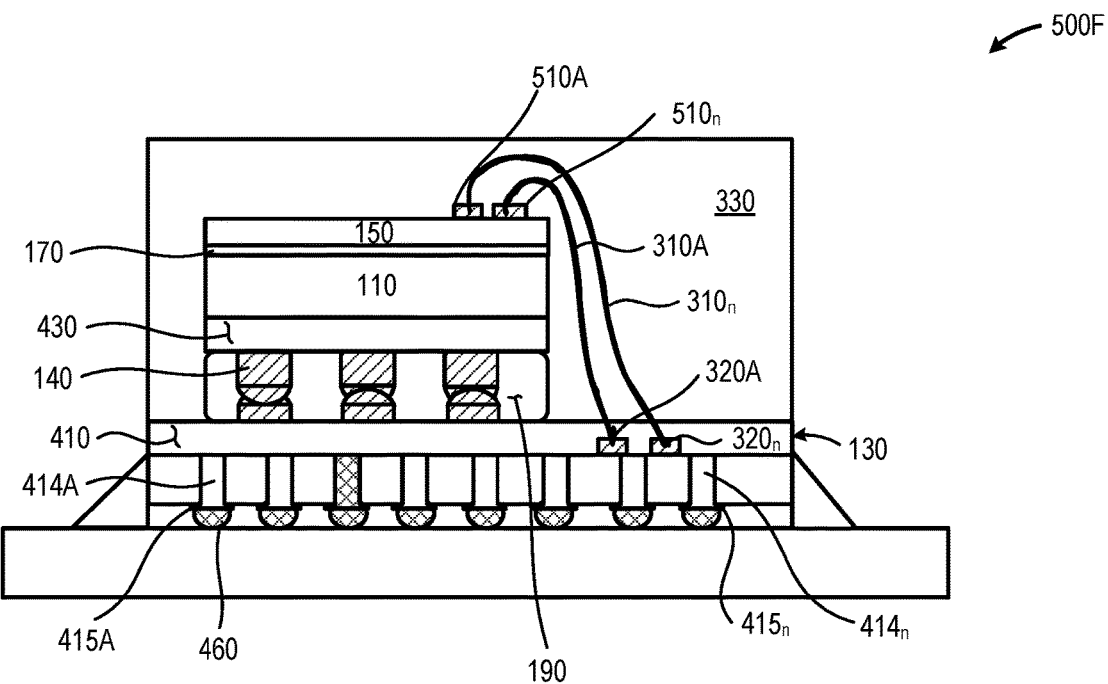
FIG. 5F depicts an illustrative process in which the active silicon substrate of the singulated package-on-silicon (PoS) semiconductor package has been conductively coupled to a substrate by reflowing the solder balls disposed on the lower surface of the active silicon substrate, in accordance with at least one embodiment described herein.

FIG. 5F depicts an illustrative process 500F in which the active silicon substrate of the singulated package-on-silicon (PoS) semiconductor package has been conductively coupled to a substrate 480 by reflowing the solder balls 460 disposed on the lower surface of the active silicon substrate 130. In embodiments, an underfill material 470 may be flowed between the lower surface of the active silicon substrate 130 and the upper surface of the substrate 480, in accordance with at least one embodiment described herein. In embodiments, the substrate 480 may include a printed circuit board having a plurality of layers of a high-density substrate.

Figure 6:
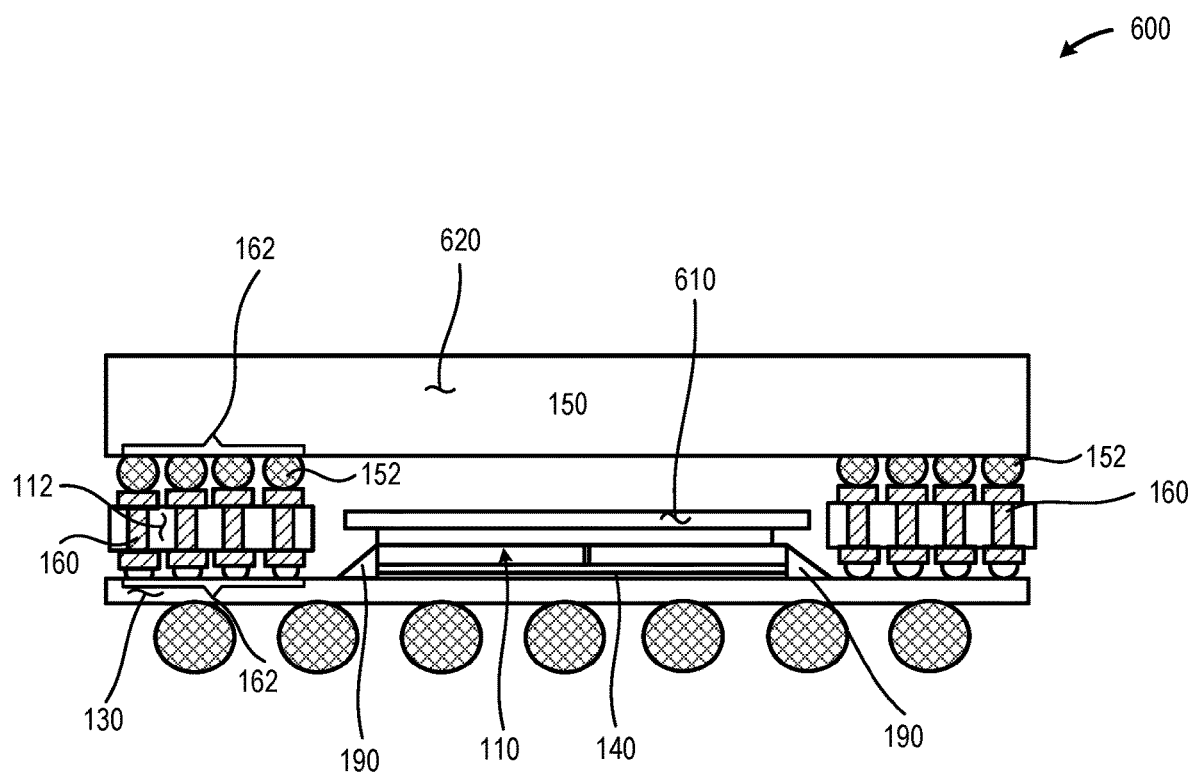
FIG. 6 is cross-sectional elevation of another illustrative package-on-silicon (PoS) semiconductor package in which a heat spreader is conductively coupled to the first semiconductor package and a gap exists between the heat spreader and the lower surface of the stacked second semiconductor package, in accordance with at least one embodiment described herein.

FIG. 6 is cross-sectional elevation of another illustrative package-on-silicon (PoS) semiconductor package 600 in which a heat spreader 610 is conductively coupled to the first semiconductor package 110 and a gap exists between the heat spreader 610 and the lower surface of the stacked second semiconductor package 150, in accordance with at least one embodiment described herein. As depicted in FIG. 6, in embodiments, the second semiconductor package 150 may not be physically or thermally coupled directly to the first semiconductor package 110. In instances, the active silicon substrate 130 communicably couples and physically connects the first semiconductor package 110 to the second semiconductor package 150 positioned above the first semiconductor package 110. In such implementations, the first semiconductor package 110 includes a plurality of interconnects 140 arranged in a first interconnect pattern 142 that are coupled to the active semiconductor substrate 130. In such implementations, a plurality of conductive structures 160 arranged in a second interconnect pattern 162 communicably couple the second semiconductor package 150 to the active silicon substrate 130. The first interconnect pattern 142 may have a greater interconnect density than the second interconnect pattern 162.

The thermal spreader 610 may thermally conductively couple to at least a portion of the upper surface of the first semiconductor package 110. In embodiments, the thermal spreader 610 may more evenly distribute thermal energy (i.e., heat) across the upper surface of the first semiconductor package 110. In embodiments, the thermal spreader 610 may assist in dissipating heat generated by the first semiconductor package 110 to the ambient environment about the PoS semiconductor package 100. In embodiments, an air gap 620 may exist between the thermal spreader 610 and the lower surface of the second semiconductor package 150 to facilitate the flow of air across the thermal spreader 610 and to facilitate the convective heat transfer between the thermal spreader 610 and the ambient environment about the PoS semiconductor package 100. In embodiments, the thermal spreader 610 may include or incorporate any number of surface features (e.g., dots, dimples, fins, vanes, and similar) to extend surface area and/or enhance the convective flow over the surface of the thermal spreader 610.

Figure 7:
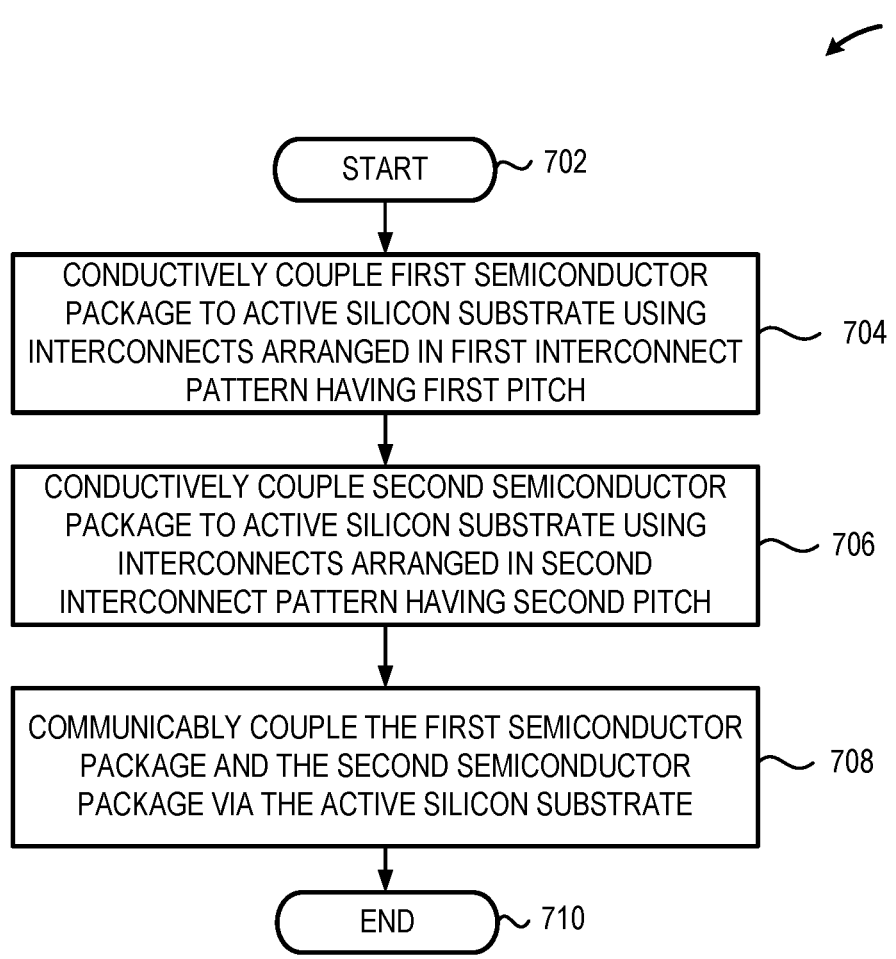
FIG. 7 is a high-level logic flow diagram of an illustrative method of fabricating a package on active silicon (PoS) semiconductor package, in accordance with at least one embodiment described herein.

FIG. 7 is a high-level logic flow diagram of an illustrative method 700 of fabricating a package on active silicon (PoS) semiconductor package, in accordance with at least one embodiment described herein. The PoS semiconductor package includes a first semiconductor package 110 conductively coupled by a plurality of interconnects 140 arranged in a first interconnect pattern 142 to an active silicon substrate 130. The PoS semiconductor package also includes a second semiconductor package 150 conductively coupled by a plurality of conductive members 160 or wirebonds 310 arranged in a second interconnect pattern 162 to the active silicon substrate 130. The active silicon substrate 130 communicably couples the first semiconductor package 110 to the second semiconductor package 150. The method 700 commences at 702.

At 704, a first semiconductor package 110 is conductively coupled to an active silicon substrate 130 using a plurality of interconnects 140 arranged in a first interconnect pattern 142. The first interconnect pattern 142 includes a plurality of interconnects 140 arranged on a first pitch (e.g., interconnect spacing). In embodiments, the first pitch may be less than 50 micrometers (μm).

At 706, a second semiconductor package 150 is conductively coupled to the active silicon substrate 130. In embodiments, the second semiconductor package 150 may be conductively coupled to the active silicon substrate 130 using a plurality of conductive members 160 extending from the surface of the active silicon substrate 130 and arranged in a second interconnect pattern 162. In embodiments, the second semiconductor package or device 150 may be conductively coupled to the active silicon substrate 130 using a plurality of wirebonds 310 conductively coupled to a plurality of conductive pads 320 disposed in the second interconnect pattern 162 across the upper surface of the active silicon substrate 130. The second interconnect pattern 162 includes a plurality of interconnects 160 or a plurality of conductive pads 320 arranged on a second pitch (e.g., interconnect/conductive pad spacing). In embodiments, the second pitch may be greater than 150 micrometers (μm).

At 708, the active silicon substrate 130 communicably couples the first semiconductor package 110 and the second semiconductor package 150 to facilitate bidirectional exchange of data and/or information between the first semiconductor package 110 and the second semiconductor package 150. The method 700 concludes at 710.

Figure 8:
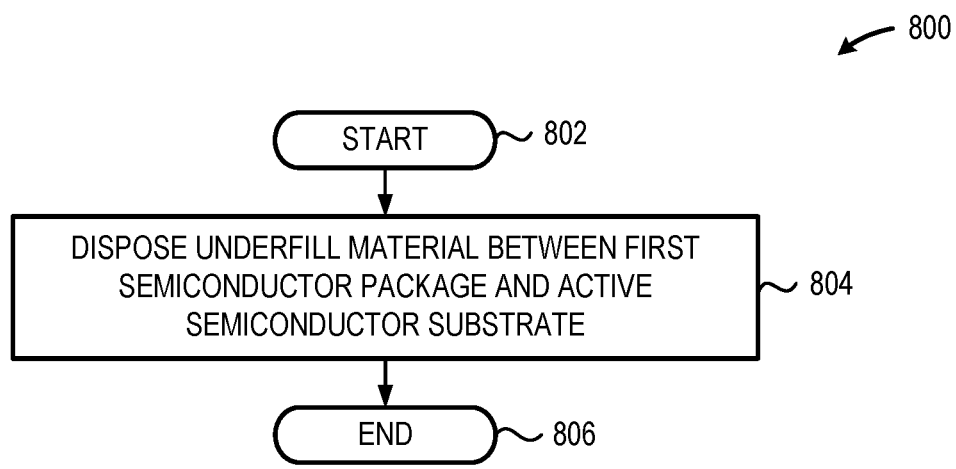
FIG. 8 is a high-level logic flow diagram of an illustrative method of fabricating a package on active silicon (PoS) semiconductor package, in accordance with at least one embodiment described herein.

FIG. 8 is a high-level logic flow diagram of an illustrative method 800 of fabricating a package on active silicon (PoS) semiconductor package, in accordance with at least one embodiment described herein. The method 800 may be used in conjunction with the method 700 described in detail in FIG. 7. The PoS semiconductor package includes a first semiconductor package 110 conductively coupled by a plurality of interconnects 140 to an active silicon substrate 130. The method 800 commences at 802.

At 804, an underfill material 190 may be flowed in the space formed between the lower surface of the first semiconductor package 110 and the upper surface of the active silicon substrate 130. In embodiments, the underfill material 190 may include any number and/or combination of materials that are flowable and curable to a semi-rigid or rigid final state. In embodiments, the underfill material 190 may include an electrically non-conductive material having a high thermal conductivity. For example, the underfill material 190 may have a thermal conductivity of greater than: about 1 Watt/meter-Kelvin (W/m-K); about 2 W/m-K; about 3 W/m-K; about 5 W/m-K; about 10 W/m-K; about 12 W/m-K; about 15 W/m-K; or about 20 W/m-K. The method 800 concludes at 806.

Figure 9:
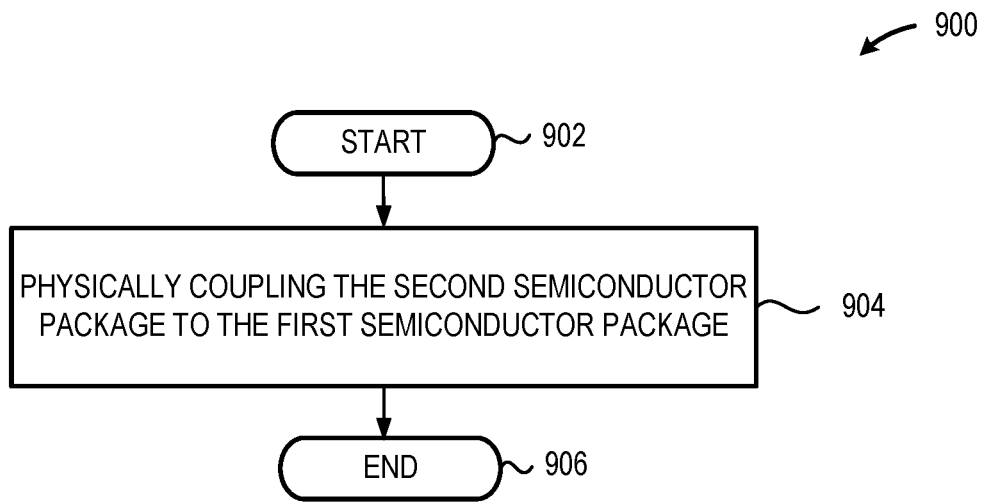
FIG. 9 is a high-level logic flow diagram of an illustrative method of fabricating a package on active silicon (PoS) semiconductor package, in accordance with at least one embodiment described herein.

FIG. 9 is a high-level logic flow diagram of an illustrative method 900 of fabricating a package on active silicon (PoS) semiconductor package, in accordance with at least one embodiment described herein. The method 900 may be used in conjunction with the method 700 described in detail in FIG. 7 and/or the method 800 described in detail in FIG. 8. The PoS semiconductor package includes a second semiconductor package 150 disposed above a first semiconductor package 110 such that at least a portion of the lower surface of the second semiconductor package 150 overlaps at least a portion of the upper surface of the first semiconductor package 110. The method 900 commences at 902.

At 904, the second semiconductor package 150 is physically coupled to the first semiconductor package 110. In embodiments, the lower surface of the second semiconductor package 150 may be bonded to the upper surface of the first semiconductor package 110 using an adhesive material 170. In some implementations, the adhesive material may include an epoxy based adhesive material having a high thermal conductivity. For example, the adhesive material 170 may have a thermal conductivity of greater than: about 1 Watt/meter-Kelvin (W/m-K); about 2 W/m-K; about 3 W/m-K; about 5 W/m-K; about 10 W/m-K; about 12 W/m-K; about 15 W/m-K; or about 20 W/m-K. The method 900 concludes at 906.

Figure 10:
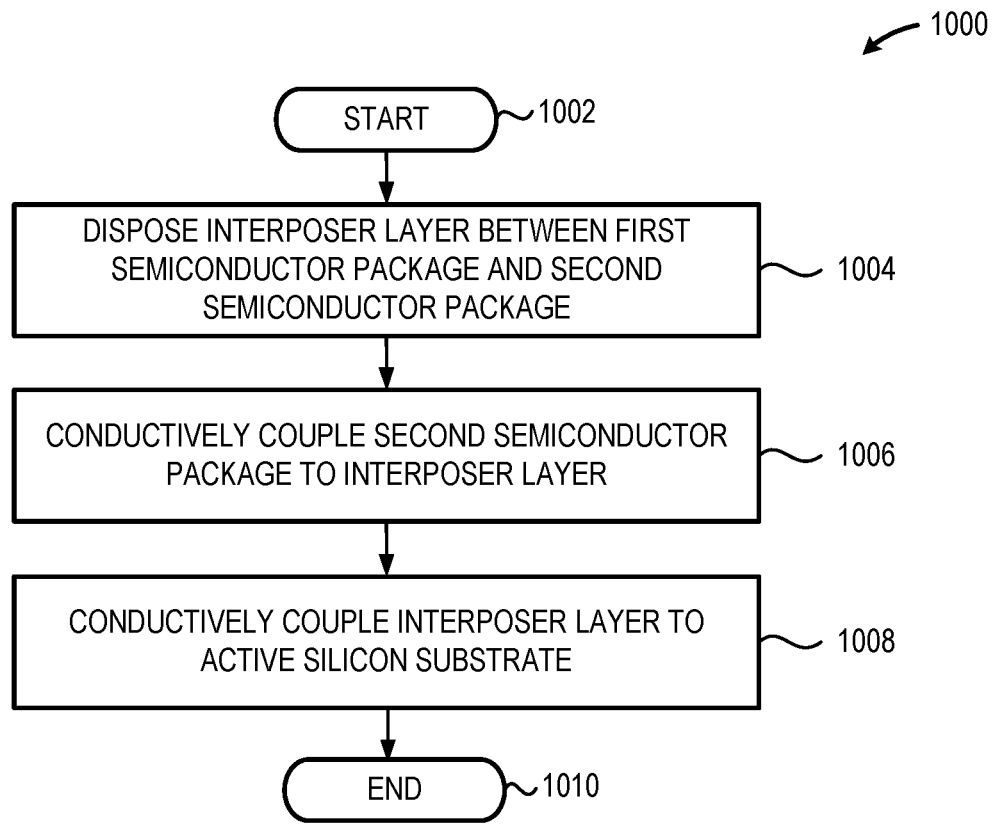
FIG. 10 is a high-level logic flow diagram of an illustrative method of fabricating a package on active silicon (PoS) semiconductor package, in accordance with at least one embodiment described herein.

FIG. 10 is a high-level logic flow diagram of an illustrative method 1000 of fabricating a package on active silicon (PoS) semiconductor package, in accordance with at least one embodiment described herein. The method 1000 may be used in conjunction with the method 700 described in detail in FIG. 7, the method 800 described in detail in FIG. 8, and/or the method 900 described in detail in FIG. 9. In embodiments, the PoS semiconductor package may include an interposer layer 210 disposed between the lower surface of the second semiconductor package 150 and the upper surface of the first semiconductor package 110. The method 1000 commences at 1002.

At 1004, an interposer layer 210 is disposed between the lower surface of the second semiconductor package 150 and the upper surface of the first semiconductor package 110. In embodiments, the interposer layer 210 includes a plurality of conductive features, such as a plurality of solder balls 222, that, when reflowed, conductively couple the interposer layer 210 (and, hence, the second semiconductor package 150) to the conductive members 160 extending from the upper surface of the active silicon substrate 130.

The interposer layer 210 translates the contact pattern or pitch on the lower surface of the second semiconductor package 150 to the second interconnect pattern 162. In some implementations, the interposer layer 210 includes an organic pitch redistribution layer 220 sandwiched between an upper conductive layer 230 that includes and/or incorporates the conductive features 232 and a lower conductive layer 240 that includes and/or incorporates the plurality of solder balls 222 used to conductively couple the interposer layer 210 to the conductive members 160.

At 1006, the second semiconductor package 150 conductively couples to the interposer layer 210.

At 1008, the interposer layer 210 conductively couples to the active silicon substrate 130. In embodiments, the lower surface of the interposer layer 210 may be physically affixed, coupled, and/or bonded to the upper surface of the first semiconductor package 110 using one or more chemically active or thermosetting adhesives, such as a high thermal conductivity adhesive 170 that promotes the flow of heat transversely and upwardly through the PoS semiconductor package. The method 1000 concludes at 1010.

While FIGS. 7 through 10 illustrate various operations according to one or more embodiments, it is to be understood that not all of the operations depicted in FIGS. 7 through 10 are necessary for other embodiments. Indeed, it is fully contemplated herein that in other embodiments of the present disclosure, the operations depicted in FIGS. 7 through 10, and/or other operations described herein, may be combined in a manner not specifically shown in any of the drawings, but still fully consistent with the present disclosure. Thus, claims directed to features and/or operations that are not exactly shown in one drawing are deemed within the scope and content of the present disclosure.

As used in this application and in the claims, a list of items joined by the term "and/or" can mean any combination of the listed items. For example, the phrase "A, B and/or C" can mean A; B; C; A and B; A and C; B and C; or A, B and C. As used in this application and in the claims, a list of items joined by the term "at least one of" can mean any combination of the listed terms. For example, the phrases "at least one of A, B or C" can mean A; B; C; A and B; A and C; B and C; or A, B and C.

Thus, the present disclosure is directed to systems and methods for providing a low profile stacked die semiconductor package in which a first semiconductor package is stacked with a second semiconductor package and both semiconductor packages are conductively coupled to an active silicon substrate that communicably couples the first semiconductor package to the second semiconductor package. The first semiconductor package may conductively couple to the active silicon substrate using a plurality of interconnects disposed in a first interconnect pattern having a first interconnect pitch. The second semiconductor package may conductively couple to the active silicon substrate using a plurality of interconnects disposed in a second interconnect pattern having a second pitch that is greater than the first pitch. The second semiconductor package may be stacked on the first semiconductor package and conductively coupled to the active silicon substrate using a plurality of conductive members or a plurality of wirebonds.

The following examples pertain to further embodiments. The following examples of the present disclosure may comprise subject material such as at least one device, a method, at least one machine-readable medium for storing instructions that when executed cause a machine to perform acts based on the method, means for performing acts based on the method and/or a system for improving and enhancing lateral heat distribution across the upper surface of a first semiconductor package in a PoP semiconductor package and improving and enhancing the flow of heat from a first semiconductor package to a second semiconductor package within a PoP semiconductor package.

According to example 1, there is provided a package-on-silicon (PoS) semiconductor package. The PoS semiconductor package may include: an active silicon substrate having: an upper surface; a lower surface; and a plurality of conductive structures disposed across the upper surface; where the plurality of conductive structures includes: a first portion of conductive structures disposed in a first pattern across the upper surface of the active silicon substrate; and a second portion of conductive structures disposed in a second pattern across the upper surface of the active silicon substrate; a first semiconductor package having an upper surface, a lower surface, and a plurality of conductive bumps disposed in the first pattern across the lower surface of the first semiconductor package; where the plurality of conductive bumps communicably couple the first semiconductor package to the first portion of conductive structures disposed on the active silicon substrate; and a second semiconductor package having an upper surface and a lower surface; the second semiconductor package disposed such that at least a portion of the first semiconductor package is disposed between the lower surface of the second semiconductor package and the upper surface of the active silicon substrate; and the second semiconductor package communicably coupled, via a plurality of conductive members, to at least some of the second portion of conductive structures disposed on the active silicon substrate, wherein the active silicon substrate communicably couples the first semiconductor package to the second semiconductor package.

Example 2 may include elements of example 1 where the first pattern comprises conductive structures disposed on a first pitch of 50 micrometers (μm) or less; and where the second pattern comprises conductive structures disposed on a second pitch of 150 μm or more.

Example 3 may include elements of any of examples 1 or 2 where one or more adhesives physically couple the lower surface of the second semiconductor package to at least a portion of the upper surface of the first semiconductor package.

Example 4 may include elements of any of examples 1 through 3 where the lower surface of the second semiconductor package overhangs at least a portion of an edge of the upper surface of the first semiconductor package.

Example 5 may include elements of any of examples 1 through 4 where the plurality of conductive bumps on the lower surface of the second semiconductor package include a plurality of conductive bumps disposed about the portion of the second semiconductor package that overhangs the upper surface of the first semiconductor package; and where the plurality of conductive members comprise a plurality of conductive pillars that communicably couple at least some of the plurality of conductive bumps disposed about the portion of the second semiconductor package that overhangs the upper surface of the first semiconductor package to at least some of the second portion of conductive structures disposed on the upper surface of the active silicon substrate.

Example 6 may include elements any of examples 1 through 5, and the PoS semiconductor package may additionally include an interposer layer disposed between the upper surface of the first semiconductor package and the lower surface of the second semiconductor package, the interposer layer including: a plurality of conductive pads disposed across an upper surface of the interposer layer; a plurality of conductive structures disposed across at least a portion of a lower surface of the interposer layer; and a plurality of conductors communicably coupling at least some of the plurality of conductive pads disposed on the upper surface of the interposer layer to at least some of the plurality of conductive structures disposed on the lower surface of the interposer layer.

Example 7 may include elements any of examples 1 through 6 where each of at least some of the plurality of conductive bumps disposed on the lower surface of the second semiconductor package physically and communicably couple to corresponding ones of the plurality of conductive pads disposed across the upper surface of the interposer layer; and where the interposer layer includes an adhesive disposed across at least a portion of the lower surface of the interposer layer to physically couple the second semiconductor package and the interposer layer to the first semiconductor package.

Example 8 may include elements of any of examples 1 through 7 where the lower surface of the interposer layer overhangs at least a portion of an edge of the upper surface of the first semiconductor package.

Example 9 may include elements of any of examples 1 through 8 where the plurality of conductive structures on the lower surface of the interposer layer include a plurality of conductive bumps disposed about the portion of the organic interposer layer that overhangs the upper surface of the first semiconductor package; and where the plurality of conductive members comprise a plurality of conductive pillars that communicably couple each of at least some of the conductive bumps disposed about the portion of the interposer layer that overhangs the upper surface of the first semiconductor package to corresponding ones of the second portion of conductive structures disposed on the upper surface of the active silicon substrate.

Example 10 may include elements of any of examples 1 through 9 where the plurality of conductive members communicably coupled to the second semiconductor package comprise a plurality of wirebonds communicably coupled to the second semiconductor package; and where each of at least some of the plurality of wirebonds communicably couple to corresponding ones of the second portion of conductive structures disposed on the surface of the active silicon substrate.

According to example 11, there is provided a package-on-silicon (PoS) semiconductor package manufacturing method. The method may include: conductively coupling each of a plurality of conductive structures disposed on a lower surface of a first semiconductor package to corresponding ones of a first portion of conductive structures disposed in a first pattern across an upper surface of an active silicon substrate; conductively coupling each of a plurality of conductive structures disposed on a second semiconductor package to corresponding ones of a second portion of conductive structures disposed in a second pattern across the upper surface of the active silicon substrate; where the second semiconductor package is operably coupled to the active silicon substrate such that at least a portion of the first semiconductor package is disposed between at least a portion of a lower surface of the second semiconductor package and the upper surface of the active silicon substrate; and communicably coupling the first semiconductor package to the second semiconductor package via the active silicon substrate.

Example 12 may include elements of example 11, and the method may additionally include disposing an underfill material between a lower surface of the first semiconductor package and an upper surface of the active silicon substrate.

Example 13 may include elements of any of examples 11 or 12 where conductively coupling each of a plurality of conductive structures disposed on a second semiconductor package to corresponding ones of a second portion of conductive structures disposed in a second pattern across the upper surface of the active silicon substrate may include: conductively coupling a second semiconductor package having a plurality of conductive structures disposed in the second pattern on the lower surface of the second semiconductor package to the second portion of conductive structures disposed on the upper surface of the active silicon substrate.

Example 14 may include elements of any of examples 11 through 13, and the method may additionally include: adhesively coupling at least a portion of the lower surface of the second semiconductor package to at least a portion of the upper surface of the first semiconductor package.

Example 15 may include elements of any of examples 11 through 14 where adhesively coupling at least a portion of the lower surface of the second semiconductor package to at least a portion of the upper surface of the first semiconductor package may include: adhesively coupling at least the portion of the lower surface of the second semiconductor package to at least the portion of the upper surface of the first semiconductor package such that at least a portion of the lower surface of the second semiconductor package overhangs at least a portion of an edge of the upper surface of the first semiconductor package.

Example 16 may include elements of any of examples 11 through 15 where conductively coupling each of a plurality of conductive structures disposed on a second semiconductor package to corresponding ones of a second portion of conductive structures disposed in a second pattern across the upper surface of the active silicon substrate may include: conductively coupling each of at least some of a plurality of conductive structures disposed about the portion of the lower surface of the second semiconductor package that overhangs the upper surface of the first semiconductor package to corresponding ones of the second portion of conductive structures disposed on the upper surface of the active silicon substrate.

Example 17 may include elements of any of examples 11 through 16 where conductively coupling each of at least some of a plurality of conductive structures disposed about the portion of the lower surface of the second semiconductor package that overhangs the upper surface of the first semiconductor package to corresponding ones of the second portion of conductive structures disposed on the upper surface of the active silicon substrate may include: conductively coupling, via conductive pillars, each of at least some of the plurality of conductive structures disposed about the portion of the lower surface of the second semiconductor package that overhangs the upper surface of the first semiconductor package to corresponding ones of the second portion of conductive structures disposed in the second pattern on the upper surface of the active silicon substrate.

Example 18 may include elements of any of examples 11 through 17, and the method may additionally include: disposing an interposer layer between an upper surface of the first semiconductor package and the lower surface of the second semiconductor package, the interposer layer including: a plurality of conductive pads disposed across an upper surface of the interposer layer; a plurality of conductive structures disposed across at least a portion of a lower surface of the interposer layer; and a plurality of conductors communicably coupling at least some of the plurality of conductive pads disposed on the upper surface of the interposer layer to at least some of the plurality of conductive structures on the lower surface of the interposer layer.

Example 19 may include elements of any of examples 11 through 18 where conductively coupling a second semiconductor package to a second portion of conductive structures disposed on the upper surface of the active silicon substrate further may include: conductively coupling each of at least some of the plurality of conductive structures disposed in the second pattern on a lower surface of the second semiconductor package to corresponding ones of the plurality of conductive pads disposed across the upper surface of the interposer layer; and conductively coupling each of at least some of the plurality of conductive structures disposed across at least a portion of a lower surface of the interposer layer to corresponding ones of the second portion of conductive structures disposed on the upper surface of the active silicon substrate.

Example 20 may include elements of any of examples 11 through 19, and the method may additionally include: adhesively coupling the lower surface of the interposer layer to at least a portion of an upper surface of the first semiconductor package to physically couple the interposer layer and the second semiconductor package to the first semiconductor package.

Example 21 may include elements of any of examples 11 through 20 where adhesively coupling the lower surface of the interposer layer to at least a portion of an upper surface of the first semiconductor package may further include: adhesively coupling the lower surface of the interposer layer to at least a portion of an upper surface of the first semiconductor package such that at least a portion of the lower surface of the interposer layer overhangs at least a portion of an edge of the upper surface of the first semiconductor package.

Example 22 may include elements of any of examples 11 through 21 where conductively coupling each of at least some of the plurality of conductive structures disposed across at least a portion of a lower surface of the interposer layer to corresponding ones of the second portion of conductive structures disposed on the upper surface of the active silicon substrate may include: conductively coupling, via conductive pillars, each of at least some of the plurality of conductive structures disposed about the portion of the lower surface of the interposer layer that overhangs the upper surface of the first semiconductor package to a second portion of conductive structures disposed in the second pattern on the upper surface of the active silicon substrate.

Example 23 may include elements of any of examples 11 through 22 where conductively coupling a second semiconductor package to a second portion of conductive structures disposed on the upper surface of the active silicon substrate may include: conductively coupling, via each of at least some of a plurality of wirebonds, a second semiconductor package to a second portion of conductive structures disposed on the upper surface of the active silicon substrate.

According to example 24, there is provided an electronic device. The electronic device may include: a substrate having conductively coupled thereto a package-on-silicon (PoS) semiconductor package, the PoS semiconductor package including: an active silicon substrate having a plurality of conductive structures; where the plurality of conductive structures includes: a first portion of conductive structures disposed in a first pattern across at least a portion of an upper surface of the active silicon substrate; and a second portion of conductive structures disposed in a second pattern across at least a portion of the upper surface of the active silicon substrate; a first semiconductor package having an upper surface, a lower surface, and a plurality of conductive bumps disposed in the first pattern across at least a portion of the lower surface of the first semiconductor package; where the plurality of conductive bumps communicably couple the first semiconductor package to the first portion of conductive structures disposed on the upper surface of the active silicon substrate; and a second semiconductor package having an upper surface and a lower surface; the second semiconductor package disposed above the upper surface of the first semiconductor package; and the second semiconductor package communicably coupled, via a plurality of conductive members, to at least some of the second portion of conductive structures disposed on the upper surface of the active silicon substrate; where the active silicon substrate communicably couples the first semiconductor package to the second semiconductor package.

Example 25 may include elements of example 24 where the first pattern comprises conductive structures disposed on a first pitch of 50 micrometers (μm) or less; and where the second pattern comprises conductive structures disposed on a second pitch of 150 μm or more.

Example 26 may include elements of any of examples 24 or 25 where one or more adhesives physically couple the lower surface of the second semiconductor package to at least a portion of the upper surface of the first semiconductor package.

Example 27 may include elements of any of examples 24 through 26 where the lower surface of the second semiconductor package overhangs at least a portion of an edge of the upper surface of the first semiconductor package.

Example 28 may include elements of any of examples 24 through 27 where the plurality of conductive bumps on the lower surface of the second semiconductor package include a plurality of conductive bumps disposed about the portion of the second semiconductor package that overhangs the upper surface of the first semiconductor package; and where the plurality of conductive members comprise a plurality of conductive pillars that communicably couple at least some of the plurality of conductive bumps disposed about the portion of the second semiconductor package that overhangs the upper surface of the first semiconductor package to at least some of the second portion of conductive structures disposed on the active silicon substrate.

Example 29 may include elements of any of examples 24 through 28, and the electronic device may additionally include: an interposer layer disposed between the upper surface of the first semiconductor package and the lower surface of the second semiconductor package, the interposer layer including: a plurality of conductive pads disposed across an upper surface of the interposer layer; a plurality of conductive structures disposed across at least a portion of a lower surface of the interposer layer; and a plurality of conductors communicably coupling at least some of the plurality of conductive pads disposed on the upper surface of the interposer layer to at least some of the plurality of conductive structures disposed on the lower surface of the interposer layer.

Example 30 may include elements of any of examples 24 through 29 where the plurality of conductive bumps disposed on the lower surface of the second semiconductor package communicably couple to corresponding ones of the plurality of conductive pads disposed across the upper surface of the interposer layer; and where the interposer layer further includes an adhesive disposed across at least a portion of the lower surface of the interposer layer to physically couple the interposer layer and the second semiconductor package to the first semiconductor package.

Example 31 may include elements of any of examples 24 through 30 where the lower surface of the interposer layer overhangs at least a portion of an edge of the upper surface of the first semiconductor package.

Example 32 may include elements of any of examples 24 through 31 where the plurality of conductive structures on the lower surface of the interposer layer include a plurality of conductive bumps disposed about the portion of the organic interposer layer that overhangs the upper surface of the first semiconductor package; and where the plurality of conductive members comprise a plurality of conductive pillars that communicably couple at least some of the conductive bumps disposed about the portion of the organic interposer layer that overhangs the upper surface of the first semiconductor package to corresponding ones of the second portion of conductive structures disposed on the upper surface of the active silicon substrate.

Example 33 may include elements of any of examples 24 through 32 where the plurality of conductive members communicably coupled to the second semiconductor package comprise a plurality of wirebonds communicably coupled to the second semiconductor package; and where each of at least some of the plurality of wirebonds communicably couple to each of at least some of the second portion of conductive structures disposed on the upper surface of the active silicon substrate.

According to example 34, there is provided a package-on-silicon (PoS) semiconductor package manufacturing system. The system may include: means for conductively coupling each of a plurality of conductive structures disposed on a lower surface of a first semiconductor package to corresponding ones of a first portion of conductive structures disposed in a first pattern across an upper surface of an active silicon substrate; means for conductively coupling each of a plurality of conductive structures disposed on a second semiconductor package to corresponding ones of a second portion of conductive structures disposed in a second pattern across the upper surface of the active silicon substrate; where the second semiconductor package is operably coupled to the active silicon substrate such that at least a portion of the first semiconductor package is disposed between at least a portion of a lower surface of the second semiconductor package and the upper surface of the active silicon substrate; and communicably coupling the first semiconductor package to the second semiconductor package via the active silicon substrate.

Example 35 may include elements of example 34, and the system may additionally include: means for disposing a mold compound about at least a portion of a perimeter of the first semiconductor package.

Example 36 may include elements of any of examples 34 or 35 where the means for conductively coupling each of a plurality of conductive structures disposed on a second semiconductor package to corresponding ones of a second portion of conductive structures disposed in a second pattern across the upper surface of the active silicon substrate may include: means for conductively coupling a second semiconductor package having a plurality of conductive structures disposed in the second pattern on the lower surface of the second semiconductor package to the second portion of conductive structures disposed on the upper surface of the active silicon substrate.

Example 37 may include elements of any of examples 34 through 36, and the system may additionally include: means for physically coupling at least a portion of the lower surface of the second semiconductor package to at least a portion of the upper surface of the first semiconductor package.

Example 38 may include elements of any of examples 34 through 37 where the means for physically coupling at least a portion of the lower surface of the second semiconductor package to at least a portion of the upper surface of the first semiconductor package may include: means for physically coupling at least the portion of the lower surface of the second semiconductor package to at least the portion of the upper surface of the first semiconductor package such that at least a portion of the lower surface of the second semiconductor package overhangs at least a portion of an edge of the upper surface of the first semiconductor package.

Example 39 may include elements of any of examples 34 through 38 where the means for conductively coupling each of a plurality of conductive structures disposed on a second semiconductor package to corresponding ones of a second portion of conductive structures disposed in a second pattern across the upper surface of the active silicon substrate may include: means for conductively coupling each of at least some of a plurality of conductive structures disposed about the portion of the lower surface of the second semiconductor package that overhangs the upper surface of the first semiconductor package to corresponding ones of the second portion of conductive structures disposed on the upper surface of the active silicon substrate.

Example 40 may include elements of any of examples 34 through 39 where the means for conductively coupling each of at least some of a plurality of conductive structures disposed about the portion of the lower surface of the second semiconductor package that overhangs the upper surface of the first semiconductor package to corresponding ones of the second portion of conductive structures disposed on the upper surface of the active silicon substrate may include: conductively coupling, via conductive pillars, each of at least some of the plurality of conductive structures disposed about the portion of the lower surface of the second semiconductor package that overhangs the upper surface of the first semiconductor package to corresponding ones of the second portion of conductive structures disposed in the second pattern on the upper surface of the active silicon substrate.

Example 41 may include elements of any of examples 34 through 40, and the system may further include: means for disposing an interposer layer between an upper surface of the first semiconductor package and the lower surface of the second semiconductor package, the interposer layer including: a plurality of conductive pads disposed across an upper surface of the interposer layer; a plurality of conductive structures disposed across at least a portion of a lower surface of the interposer layer; and a plurality of conductors communicably coupling at least some of the plurality of conductive pads disposed on the upper surface of the interposer layer to at least some of the plurality of conductive structures on the lower surface of the interposer layer.

Example 42 may include elements of any of examples 34 through 41 where the means for conductively coupling a second semiconductor package to a second portion of conductive structures disposed on the upper surface of the active silicon substrate may further include: means for conductively coupling each of at least some of the plurality of conductive structures disposed in the second pattern on a lower surface of the second semiconductor package to corresponding ones of the plurality of conductive pads disposed across the upper surface of the interposer layer; and means for conductively coupling each of at least some of the plurality of conductive structures disposed across at least a portion of a lower surface of the interposer layer to corresponding ones of the second portion of conductive structures disposed on the upper surface of the active silicon substrate.

Example 43 may include elements of any of examples 34 through 42, and the system may further include: means for physically coupling the lower surface of the interposer layer to at least a portion of an upper surface of the first semiconductor package to physically couple the interposer layer and the second semiconductor package to the first semiconductor package.

Example 44 may include elements of any of examples 34 through 43 where the means for physically coupling the lower surface of the interposer layer to at least a portion of an upper surface of the first semiconductor package may further include: means for physically coupling the lower surface of the interposer layer to at least a portion of an upper surface of the first semiconductor package such that at least a portion of the lower surface of the interposer layer overhangs at least a portion of an edge of the upper surface of the first semiconductor package.

Example 45 may include elements of any of examples 34 through 44 where the means for conductively coupling each of at least some of the plurality of conductive structures disposed across at least a portion of a lower surface of the interposer layer to corresponding ones of the second portion of conductive structures disposed on the upper surface of the active silicon substrate may include: means for conductively coupling, via conductive pillars, each of at least some of the plurality of conductive structures disposed about the portion of the lower surface of the interposer layer that overhangs the upper surface of the first semiconductor package to a second portion of conductive structures disposed in the second pattern on the upper surface of the active silicon substrate.

Example 46 may include elements of any of examples 34 through 45 where the means for conductively coupling a second semiconductor package to a second portion of conductive structures disposed on the upper surface of the active silicon substrate may include: means for conductively coupling, via each of at least some of a plurality of wirebonds, a second semiconductor package to a second portion of conductive structures disposed on the upper surface of the active silicon substrate.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed is:

1. A package-on-silicon (PoS) semiconductor package, comprising:
an active silicon substrate, the active silicon substrate including semiconductor devices, and the active silicon substrate having:
an upper surface;
a lower surface; and
a plurality of conductive structures disposed across the upper surface;
wherein the plurality of conductive structures includes:
a first portion of conductive structures disposed in a first pattern across the upper surface of the active silicon substrate, the first portion of conductive structures having a first density; and
a second portion of conductive structures disposed in a second pattern across the upper surface of the active silicon substrate, the second portion of conductive structures having a second density, wherein the first density is greater than the second density;
a first semiconductor package having an upper surface, a lower surface, and a plurality of conductive bumps disposed in the first pattern across the lower surface of the first semiconductor package, the first semiconductor package above the active silicon substrate and comprising a semiconductor die, the semiconductor die having a height above the active silicon substrate;
wherein the plurality of conductive bumps communicably couple the first semiconductor package to the first portion of conductive structures disposed on the active silicon substrate;
a thermally conductive adhesive layer over and in contact with the upper surface of the first semiconductor package, the thermally conductive adhesive layer in direct contact with and extending laterally beyond the semiconductor die of the first semiconductor package; and
a second semiconductor package having an upper surface and a lower surface;
the second semiconductor package disposed such that at least a portion of the first semiconductor package is disposed between the lower surface of the second semiconductor package and the upper surface of the active silicon substrate; and
the second semiconductor package communicably coupled, via a plurality of conductive members, to at least some of the second portion of conductive structures disposed on the active silicon substrate, wherein the active silicon substrate communicably couples the first semiconductor package to the second semiconductor package, wherein the height of the semiconductor die above the active silicon substrate is at least as high as a height of the plurality of conductive members above the active silicon substrate;
wherein the first pattern comprises conductive structures disposed on a first pitch of 50 micrometers (µm) or less; and
wherein the second pattern comprises conductive structures disposed on a second pitch of 150 µm or more; and an interposer layer disposed between the upper surface of the first semiconductor package and the lower surface of the second semiconductor package, the interposer layer including:
a plurality of conductive pads disposed across an upper surface of the interposer layer;
a plurality of conductive structures disposed across at least a portion of a lower surface of the interposer layer; and
a plurality of conductors communicably coupling at least some of the plurality of conductive pads disposed on the upper surface of the interposer layer to at least some of the plurality of conductive structures disposed on the lower surface of the interposer layer.

2. The PoS semiconductor package of claim 1 wherein one or more adhesives physically couple the lower surface of the second semiconductor package to at least a portion of the upper surface of the first semiconductor package.

3. The PoS semiconductor package of claim 2 wherein the lower surface of the second semiconductor package overhangs at least a portion of an edge of the upper surface of the first semiconductor package.

4. The PoS semiconductor package of claim 3;
wherein the plurality of conductive members are on the lower surface of the second semiconductor package and include a plurality of conductive bumps disposed about the portion of the second semiconductor package that overhangs the upper surface of the first semiconductor package; and
wherein the plurality of conductive members comprise a plurality of conductive pillars that communicably couple at least some of the plurality of conductive bumps disposed about the portion of the second semiconductor package that overhangs the upper surface of the first semiconductor package to at least some of the second portion of conductive structures disposed on the upper surface of the active silicon substrate.

5. The PoS semiconductor package of claim 1:
wherein each of at least some of the plurality of conductive structures disposed on the lower surface of the second semiconductor package physically and communicably couple to corresponding ones of the plurality of conductive pads disposed across the upper surface of the interposer layer; and
wherein the interposer layer includes an adhesive disposed across at least a portion of the lower surface of the interposer layer to physically couple the second semiconductor package and the interposer layer to the first semiconductor package.

6. The PoS semiconductor package of claim 5 wherein the lower surface of the interposer layer overhangs at least a portion of an edge of the upper surface of the first semiconductor package.

7. The PoS semiconductor package of claim 6;
wherein the plurality of conductive structures on the lower surface of the interposer layer include a plurality of conductive bumps disposed about the portion of the interposer layer that overhangs the upper surface of the first semiconductor package; and
wherein the plurality of conductive members comprise a plurality of conductive pillars that communicably couple each of at least some of the conductive bumps disposed about the portion of the interposer layer that overhangs the upper surface of the first semiconductor package to corresponding ones of the second portion of conductive structures disposed on the upper surface of the active silicon substrate.

8. The PoS semiconductor package of claim 1:
wherein the plurality of conductive members communicably coupled to the second semiconductor package comprise a plurality of wirebonds communicably coupled to the second semiconductor package; and
wherein each of at least some of the plurality of wirebonds communicably couple to corresponding ones of the second portion of conductive structures disposed on the surface of the active silicon substrate.

9. A package-on-silicon (PoS) semiconductor package manufacturing method, comprising:
conductively coupling each of a plurality of conductive structures disposed on a lower surface of a first semiconductor package to corresponding ones of a first portion of conductive structures disposed in a first pattern across an upper surface of an active silicon substrate, the first semiconductor package comprising a semiconductor die, the semiconductor die having a height above the active silicon substrate, the first portion of conductive structures having a first density, and the active silicon substrate including semiconductor devices;
forming a thermally conductive adhesive layer over and in contact with an upper surface of the first semiconductor package, the thermally conductive adhesive layer in direct contact with and extending laterally beyond the semiconductor die of the first semiconductor package;
conductively coupling each of a plurality of conductive structures disposed on a second semiconductor package to corresponding ones of a second portion of conductive structures disposed in a second pattern across the upper surface of the active silicon substrate via a plurality of conductive members, the second portion of conductive structures having a second density, wherein the first density is greater than the second density, wherein the height of the semiconductor die above the active silicon substrate is at least as high as a height of the plurality of conductive members above the active silicon substrate;
wherein the second semiconductor package is operably coupled to the active silicon substrate such that at least a portion of the first semiconductor package is disposed between at least a portion of a lower surface of the second semiconductor package and the upper surface of the active silicon substrate; and
communicably coupling the first semiconductor package to the second semiconductor package via the active silicon substrate;
wherein conductively coupling each of the plurality of conductive structures disposed on a second semiconductor package to corresponding ones of a second portion of conductive structures disposed in a second pattern across the upper surface of the active silicon substrate comprises:
conductively coupling a second semiconductor package having a plurality of conductive structures disposed in the second pattern on the lower surface of the second semiconductor package to the second portion of conductive structures disposed on the upper surface of the active silicon substrate; and
disposing an interposer layer between an upper surface of the first semiconductor package and the lower surface of the second semiconductor package, the interposer layer including:
a plurality of conductive pads disposed across an upper surface of the interposer layer;
a plurality of conductive structures disposed across at least a portion of a lower surface of the interposer layer; and
a plurality of conductors communicably coupling at least some of the plurality of conductive pads disposed on the upper surface of the interposer layer to at least some of the plurality of conductive structures on the lower surface of the interposer layer.

10. The method of claim 9, further comprising:
disposing an underfill material between a lower surface of the first semiconductor package and an upper surface of the active silicon substrate.

11. The method of claim 9, further comprising:
adhesively coupling at least a portion of the lower surface of the second semiconductor package to at least a portion of the upper surface of the first semiconductor package.

12. The method of claim 11 wherein adhesively coupling at least a portion of the lower surface of the second semiconductor package to at least a portion of the upper surface of the first semiconductor package comprises:
adhesively coupling at least the portion of the lower surface of the second semiconductor package to at least the portion of the upper surface of the first semiconductor package such that at least a portion of the lower surface of the second semiconductor package overhangs at least a portion of an edge of the upper surface of the first semiconductor package.

13. The method of claim 12 wherein conductively coupling each of a plurality of conductive structures disposed on a second semiconductor package to corresponding ones of a second portion of conductive structures disposed in a second pattern across the upper surface of the active silicon substrate comprises:
conductively coupling each of at least some of a plurality of conductive structures disposed about the portion of the lower surface of the second semiconductor package that overhangs the upper surface of the first semiconductor package to corresponding ones of the second portion of conductive structures disposed on the upper surface of the active silicon substrate.

14. The method of claim 13 wherein conductively coupling each of at least some of a plurality of conductive structures disposed about the portion of the lower surface of the second semiconductor package that overhangs the upper surface of the first semiconductor package to corresponding ones of the second portion of conductive structures disposed on the upper surface of the active silicon substrate comprises:
conductively coupling, via conductive pillars, each of at least some of the plurality of conductive structures disposed about the portion of the lower surface of the second semiconductor package that overhangs the upper surface of the first semiconductor package to corresponding ones of the second portion of conductive structures disposed in the second pattern on the upper surface of the active silicon substrate.

15. The method of claim 9 wherein conductively coupling a second semiconductor package to a second portion of conductive structures disposed on the upper surface of the active silicon substrate further comprises:
conductively coupling each of at least some of the plurality of conductive structures disposed in the second pattern on a lower surface of the second semiconductor package to corresponding ones of the plurality of conductive pads disposed across the upper surface of the interposer layer; and conductively coupling each of at least some of the plurality of conductive structures disposed across at least a portion of a lower surface of the interposer layer to corresponding ones of the second portion of conductive structures disposed on the upper surface of the active silicon substrate.

16. The method of claim 15, further comprising:
adhesively coupling the lower surface of the interposer layer to at least a portion of an upper surface of the first semiconductor package to physically couple the interposer layer and the second semiconductor package to the first semiconductor package.

17. The method of claim 16 wherein adhesively coupling the lower surface of the interposer layer to at least a portion of an upper surface of the first semiconductor package further comprises:
adhesively coupling the lower surface of the interposer layer to at least a portion of an upper surface of the first semiconductor package such that at least a portion of the lower surface of the interposer layer overhangs at least a portion of an edge of the upper surface of the first semiconductor package.

18. The method of claim 17 wherein conductively coupling each of at least some of the plurality of conductive structures disposed across at least a portion of a lower surface of the interposer layer to corresponding ones of the second portion of conductive structures disposed on the upper surface of the active silicon substrate comprises:
conductively coupling, via conductive pillars, each of at least some of the plurality of conductive structures disposed about the portion of the lower surface of the interposer layer that overhangs the upper surface of the first semiconductor package to a second portion of conductive structures disposed in the second pattern on the upper surface of the active silicon substrate.

19. The method of claim 9 wherein conductively coupling a second semiconductor package to a second portion of conductive structures disposed on the upper surface of the active silicon substrate comprises:
conductively coupling, via each of at least some of a plurality of wirebonds, a second semiconductor package to a second portion of conductive structures disposed on the upper surface of the active silicon substrate.

20. A package-on-silicon (PoS) semiconductor package, comprising:
an active silicon substrate having:
an upper surface;
a lower surface; and
a plurality of conductive structures disposed across the upper surface;
wherein the plurality of conductive structures includes:
a first portion of conductive structures disposed in a first pattern across the upper surface of the active silicon substrate; and
a second portion of conductive structures disposed in a second pattern across the upper surface of the active silicon substrate;
a first semiconductor package having an upper surface, a lower surface, and a plurality of conductive bumps disposed in the first pattern across the lower surface of the first semiconductor package;
wherein the plurality of conductive bumps communicably couple the first semiconductor package to the first portion of conductive structures disposed on the active silicon substrate;
a thermally conductive adhesive over and in contact with the upper surface of the first semiconductor package; and
a second semiconductor package having an upper surface and a lower surface;
the second semiconductor package disposed such that at least a portion of the first semiconductor package is disposed between the lower surface of the second semiconductor package and the upper surface of the active silicon substrate; and
the second semiconductor package communicably coupled, via a plurality of conductive members, to at least some of the second portion of conductive structures disposed on the active silicon substrate, wherein the active silicon substrate communicably couples the first semiconductor package to the second semiconductor package, wherein the first pattern comprises conductive structures disposed on a first pitch of 50 micrometers ($\mu$m) or less, wherein the second pattern comprises conductive structures disposed on a second pitch of 150 $\mu$m or more, wherein one or more adhesives physically couple the lower surface of the second semiconductor package to at least a portion of the upper surface of the first semiconductor package, wherein the lower surface of the second semiconductor package overhangs at least a portion of an edge of the upper surface of the first semiconductor package, wherein the plurality of conductive members are on the lower surface of the second semiconductor package and include a plurality of conductive bumps disposed about the portion of the second semiconductor package that overhangs the upper surface of the first semiconductor package, and wherein the plurality of conductive members comprise a plurality of conductive pillars that communicably couple at least some of the plurality of conductive bumps disposed about the portion of the second semiconductor package that overhangs the upper surface of the first semiconductor package to at least some of the second portion of conductive structures disposed on the upper surface of the active silicon substrate.

* * * * *